United States Patent [19]

Shackleford et al.

[11] Patent Number: 5,896,521
[45] Date of Patent: Apr. 20, 1999

[54] PROCESSOR SYNTHESIS SYSTEM AND PROCESSOR SYNTHESIS METHOD

[75] Inventors: J. Barry Shackleford; Mitsuhiro Yasuda; Etsuko Okushi, all of Tokyo, Japan

[73] Assignee: Mitsubishi Denki Kabushiki Kaisha, Tokyo, Japan

[21] Appl. No.: 08/720,627

[22] Filed: Oct. 2, 1996

[30] Foreign Application Priority Data

Mar. 15, 1996 [JP] Japan .................................. 8-058749

[51] Int. Cl.$^6$ .................................................. G06F 17/50
[52] U.S. Cl. ........................ 395/500; 395/653; 395/705; 395/708
[58] Field of Search ........................ 364/488, 489, 364/490, 491; 395/500, 701, 702, 703, 705, 708, 653, 683

[56] References Cited

U.S. PATENT DOCUMENTS

| | | | |
|---|---|---|---|
| 4,922,432 | 5/1990 | Kobayashi et al. | 364/490 |
| 5,197,016 | 3/1993 | Sugimoto et al. | 364/490 |
| 5,247,668 | 9/1993 | Smith et al. | 395/600 |
| 5,274,793 | 12/1993 | Kuroda et al. | 395/500 |
| 5,410,719 | 4/1995 | Shackleford | 395/800 |
| 5,493,508 | 2/1996 | Dangelo et al. | 364/489 |
| 5,541,850 | 7/1996 | Vander Zanden et al. | 364/491 |
| 5,613,152 | 3/1997 | Van Meerbergen et al. | 395/800 |

FOREIGN PATENT DOCUMENTS

| | | | |
|---|---|---|---|
| 62-208171 | 9/1987 | Japan | G06F 15/60 |
| 3-144829 | 6/1991 | Japan | G06F 9/45 |

OTHER PUBLICATIONS

Article entitled "Copmputer Architecture—A Quantitative Approach", David A. Patterson and John L. Hennessy, Nikkei BP Corporation, Dec. 25, 1992.

"Observations on the Implementation of a Codesign Workbench PEAS–III for ASIP Design–Classification and Parameterizaytion of CPU Architectures," Kenji Kataoka et al., The Insitute of Electronics Information and Communication Engineers, Technical Report of IEICE, vol. 95, No. 421, Dec. 15, 1995.

"Proposal of a Codesign Workbench PEAS–III for ASIP Design," Akichika Shiomi et al., The Information Processing Society of Japan, Technical Report of IPSJ, vol. 95, No. 72, Jul. 20, 1995.

Livingston, B., *Of Dentists and Disk Drives*, PC–Computing, vol. 7, No. 7, (Jul. 1994), pp. 182–183.

Payne et al., "An ASIC Engine Compiler For Digital Signal Processing", IEEE, 1991, pp. 792–795.

*Primary Examiner*—Kevin J. Teska
*Assistant Examiner*—Thai Phan
*Attorney, Agent, or Firm*—Burns, Doane, Swecker & Mathis, LLP

[57] ABSTRACT

The present invention provides a processor synthesis system and a processor synthesis method which enable a designer to synthesize a CPU that does not depend on a specific process technology and has the bit width customized to the requirements of the specific application. The processor synthesis method according to the present invention comprises steps of generating and outputting processor definition information to define a CPU based on primary parameters entered by the designer; generating a compiler and an assembler for generating an instruction code for the CPU defined by the processor definition information; and executing simulation using the instruction code output by the generated compiler and the assembler so as to facilitate optimization of the designed CPU and reduce development costs.

23 Claims, 37 Drawing Sheets

Fig.10

| | OPERATION | d | s1 | s2 | μC |
|---|---|---|---|---|---|
| 1 0 | | | | | i-4  i-1 |
| 0 1 | 2 | 4 | | | |

Op CODE ~ 310
311
313
315 i: NUMBER OF BITS

000 — ADD: RF[d] ← RF[s1]+RF[s2]  ~ 410
001 — SUB(uC:8) : RF[d] ← RF[s1] - RF[s2]  ~ 412
001 — CMPA(uC:12) : RF[d] ← 1 if RF[s1] = RF[s2]  ~ 414
010 — UNASSIGNED  ~ 416
011 — OR : RF[d] ← RF[s1] OR RF[s2]  ~ 418
100 — AND : RF[d] ← RF[s1] AND RF[s2]
101 — UNASSIGNED
110 — XOR : RF[d] ← RF[s1] XOR RF[s2]  ~ 420
111 — CMP : RF[d] ← RF[s1] EQL RF[s2]  ~ 422

Fig.18

```
                       550 : parm. data

;;rfcnt    = 32 ;
;;dm_size  = 512;
;;im_size  = 1024;
;;cpuw = 16;
;;
rfcnt    = 16 ;      ～ 552
dm_size  = 512 ;     ～ 554
im_size  = 1024 ;    ～ 556
cpuw     = 11 ;      ～ 558
bdw = 8;
;;
;;rfcnt    = 128 ;
;;dm_size  = 20000;
;;im_size  = 300000;
;;cpuw = 32;
;;
;;rfcnt    = 32 ;
;;dm_size  = 16000 ;
;;im_size  = 64000;
;;cpuw = 16;
;;
;;
;;;  default value
;;
;;opw = 5;
;;ucw = 4;
;;isw = 7;
;;ccw = 4;
;;bdw = 8;
```

Fig.19

```
***** Start parameter Header Files Generation for asap_cc asap_asm revasm *****  ~ 562

===== Parameter File Generation program started.  =====
      ( Version : V1.3.0(1995/12/01) )

( User's Parameters )
CPU Bit Width                    :   11  ~ 564
The number of Register File      :   16  ~ 566
The size of data memory          :  512  ~ 568
The size of instruction memory   : 1024  ~ 570
```

```
===== Check the relation with each parameter... =====
<Check Val>: rfaw(4), imaw(10), dmaw(9), cpuw(11), opw(5), ucw(4), isw(4), ccw(4), bdw(8)

[0] alu_rr    :  op(opw)   d(rfaw)    s1(rfaw)   s2(rfaw)   uc(ucw) => 21
[1] alu_ri    :  op(opw)   d(rfaw)    s1(rfaw)   im(isw)    uc(ucw) => 21
[2] ld_str    :  op(opw)   ds(rfaw)   dma(dmaw)             => 18
[3] ld_str_id :  op(opw)   d(rfaw)    s1(rfaw)   s2(rfaw)   => 17
[4] ld_stri   :  op(opw)   d(rfaw)    lw(cpuw)              => 20
[5] jmp       :  op(opw)   d(rfaw)    ja(imaw)              => 19
[6] branch    :  op(opw)   ds(rfaw)   cc(ccw)    disp(bdw)  => 21
Instruction Length = 21

+++ "asap_parm.h" file has been generated. +++
+++ "parch.h" file has been generated.     +++
+++ "inst.info" file has been generated.   +++

===== Parameter File Generation is completely finished. =====

***** End    parameter Header Files *****
```

Fig.21

590: asap_param.h

```
/*--------------< ASAP Parameters >--------------

[ User's Parameters ]
   CPU Bit Width                    : 11
   The number of Register File      : 16
   The size of data memory          : 512
   The size of instruction memory   : 1024

[ Generated Parameters ]
   RFAW   : Register File Address Width
   IMAW   : Instruction Memory Address Width
   DMAW   : Data Memory Address Width
   CPUW   : CPU Width (Physical Bit Width)
   OPW    : OPcode Width
   UCW    : U(micro) Code Width
   ISW    : Immediate Short Width
   CCW    : Condition Code Width
   BDW    : Branch Displacement Width
   INSLEN : Instruction Length
--------------------------------------------------*/ define  RFAW    4
define  IMAW   10
#define  DMAW    9
#define  CPUW   11
#define  OPW     5
#define  UCW     4
#define  ISW     4
#define  CCW     4
#define  BDW     8
#define  INSLEN 21
```

600 : parch.h

```
#define  ASAP_WORD_SIZE            1
#define  ASAP_DATA_ADDRESS         0
#define  ASAP_RVR_NO               0
#define  ASAP_SP_NO                1
#define  ASAP_FP_NO                2
#define  ASAP_RAR_NO               3
#define  ASAP_NUM_OF_GPR           16
#define  ASAP_NUM_OF_FPR           0
#define  ASAP_NUM_OF_SRC           5
#define  ASAP_DEFAULT_WORK_GPR         4
#define  ASAP_DEFAULT_WORK_FPR         4
#define  ASAP_CHAR_SIZE            1
#define  ASAP_INT_SIZE       ASAP_WORD_SIZE
#define  ASAP_FLOAT_SIZE     ASAP_WORD_SIZE
```

```
*** Start Processor Synthesis (syn2asap) *** command : cc -O -o syn2asap syn2asap.c command : syn2asap -l mid

*** End Processor Synthesis (syn2asap) ***
```

Fig.24

610 : asap_uni2.ldf     612

```
/*  Program:    LDF for Unified ASAP Ver2.00        */
/*  Author:     Etsuko Okushi                       */
/*              Mitsuhiro Yasuda                    */
/*              Barry Shackleford                   */

/*  Copyright:  Design Systems Engineering Center   */
/*              MITSUBISHI ELECTRIC CORPORATION     */
```

/* Constants */ ～ 614 define IR    21 ～ 616
define OP    5  ～ 618
define CC    4  ～ 620
define UC    4  ～ 622
define IS    4  ～ 624
define BD    8  ～ 626

/* Synthesis Parameters */ ～ 630 define RFadrsWidth    4  ～ 632
define CPUwidth       11 ～ 634
define IMadrsWidth    10 ～ 636
define DMadrsWidth    9  ～ 638

～640

/* Calculated Parameters & Aliases */

Fig.25

```
*** Make Asembler ( asap_asm ) & Reverse Asembler ( revasm ) *** command : cc -O -o asap_asm asm_main.c utils.c -lm   ~652 command : cc -O -o revasm revasm.c   ~654 asm_main.c:
utils.c:

***** End Asembler ( asap_asm ) & Reverse Asembler ( revasm ) *****
```

```
host01 23 > asap_cc samp.c          670
                            672
initializing · · ·
ok parsing · · ·
ok connecting data structure · · ·
ok generating intermediate code · · ·
ok generating assembly code · · ·    676
output file is "samp. s"
ok

*** compilation finished successfully***
```

Fig.28

```
int main ( )                        680
{
    int         a,  b,  c ;

```
            BEGIN;
main:
            ldi %r1, 1015;
            addi %r2, %r1, 0, 0;
            ldi %r4, -6;
            add %r1, %r1, %r4, 0;
L40:
            ldi %r14, 1;
            ldi %r13, 2;
            add %r15, %r14, %r13, 0;
L41:
            halt;
            nop;
            END;
```
682

Fig.30

```
host01  28 >asap_asm samp.s
Addr    OP-code     OPR1 ....
  0 (   0)  ldi     %r1     1015
  1 (   1)  addi    %r2     %r1     -6
  2 (   2)  ldi     %r4     -6
  3 (   3)  add     %r1     %r1     1       0
  4 (   4)  ldi     %r14    1
  5 (   5)  ldi     %r13    2
  6 (   6)  add     %r15    %r14    %r4     %r13    0
  7 (   7)  halt
  8 (   8)  nop

***** Label/address Reference Table *****

L41 -->     7 (   7)
            L40 -->     4 (   4)
            main -->    0 (   0)

***** Memory Map Table *****
     Addr     data

********* Normal End **********
```

```
host01  29 >cat inst. data
[ 0]    661486 ;;  0a17ee   0101000010111101110
[ 1]      8448 ;;  002100   0000000010000100000000
[ 2]    675828 ;;  0a4ff4   0101001001111110100
[ 3]   1052992 ;;  101140   1000000100010101000000
[ 4]    712706 ;;  0ae002   0101011100000000010
[ 5]    708612 ;;  0ad004   0101011010000000100
[ 6]   1113808 ;;  10fed0   1000011111011010000
[ 7]   1572864 ;;  180000   1100000000000000000
[ 8]   2031616 ;;  1f0000   1111100000000000000
```

FUNCTIONAL COMPARISON BETWEEN ASAP AND MEGA CELL

| COMPARED ITEM | MEGA CELL | ASAP |
|---|---|---|
| PROCESSOR | AIM AT PLACING CPU ON ASIC, OPTIMIZED AS PART OF CPU | AIM AT SYSTEM GENERATION, OPTIMIZED AS PART OF GENERATED SYSTEM |
| COST AND PERFORMANCE | TARGET MAXIMUM PERFORMANCE FOR FIXED COST | TARGET MINIMUM COST FOR FIXED PERFORMANCE |
| CPU BIT WIDTH | STANDARD BIT WIDTH FIXED (4,8,16,32 BITS) | REDUCED TO REQUIRED MINIMUM |
| INSTRUCTION WORD LENGTH/ADDRESS SPACE | FIXED | REDUCED TO REQUIRED MINIMUM |
| ARCHITECTURE | FIXED | VARIABLE (PARAMETERIZED) |
| PROCESS TECHNOLOGY | DEPENDENT | INDEPENDENT |
| LICENSE | REQUIRED | NOT REQUIRED |
| COMPILER | DEFINE COMPILER FOR EXISTING PROCESSOR | DEFINE PROCESSOR FOR COMPILER BEING GENERATED |

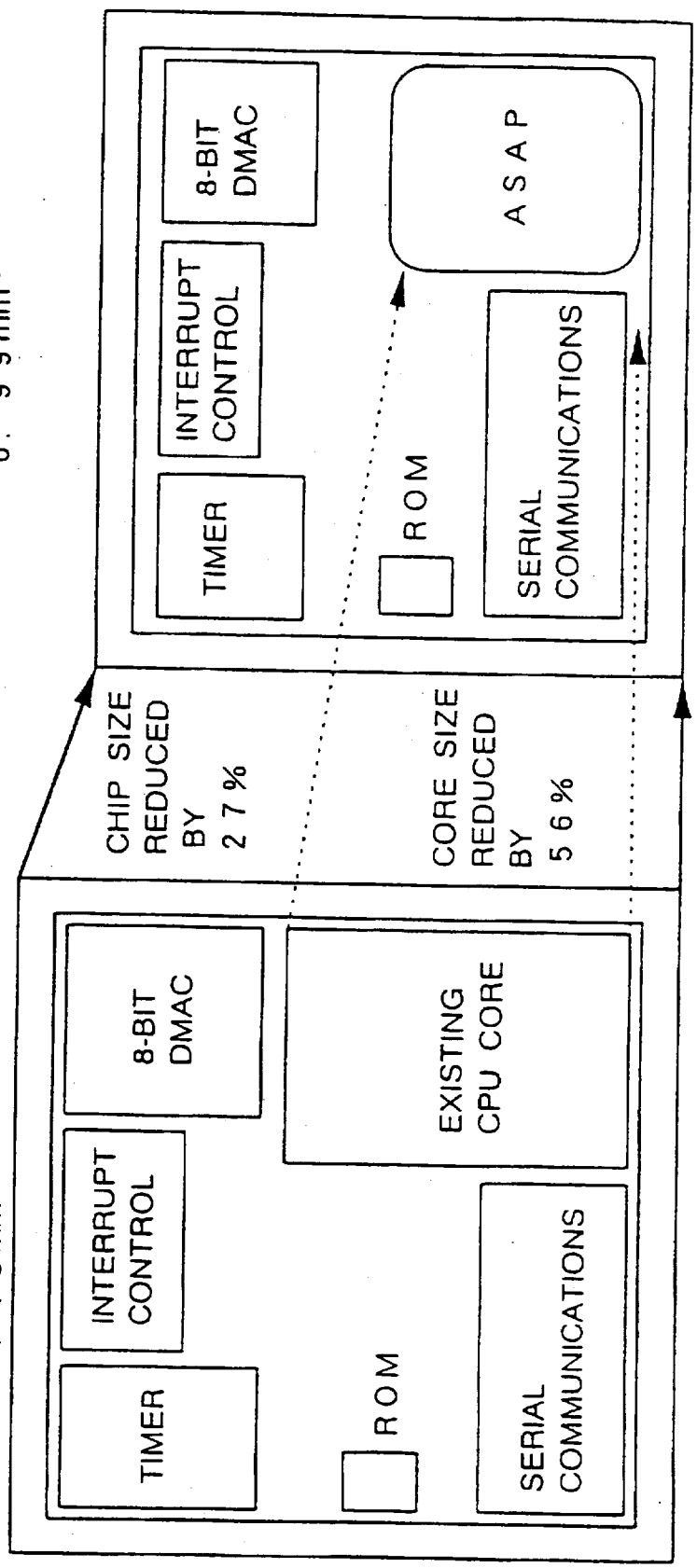

GENERAL VIEW OF MODULE GENERATION

PROCESSOR SYNTHESIS SYSTEM AND PROCESSOR SYNTHESIS METHOD

BACKGROUND OF THE INVENTION

1. Field of the Invention

The present invention relates to a processor synthesis system and a processor synthesis method for implementing an ASIC (Application Specific Integrated Circuit), an LSI circuit designed for a specific application in digital information processing control. The implemented ASICs are used in the controllers of control apparatuses, sequence controllers of multi-media apparatuses, and controllers of household appliances,

2. Discussion of the Related Art

In the conventional ASIC, a general purpose microprocessor is built in a chip as the Central Processing Unit (CPU).

When using general purpose microprocessors, users can easily select and use microprocessors which are commercially available. In this case, however, the architectures of the microprocessors have already been fixed. The CPU bitwidths of the existing microprocessors, for example, are designed to be $2^n$ bits including 8 bits, 16 bits, 32 bits, and the like. Accordingly, several functions of the microprocessors remain unused when the size of the control unit of the microprocessor is comparatively small and the control logic is simple and mainly focuses on the operation of addition, subtraction, and bit control. When the control logic can be implemented using the 10-bit CPU bitwidth, a 16-bit microprocessor must be used instead of a 10-bit microprocessor. It is because the bitwidths of the general purpose microprocessors have already been fixed and a 10-bit general purpose microprocessor is not available now. Thus, 6 bits of the CPU bitwidth remain unused.

The CPU bitwidth has a direct effect on the size of a chip. Consequently, the problem arises that a chip itself becomes highly redundant, because the CPU on that chip has the unused 6-bit data. In view of the aforementioned problems, a system has been desired which can synthesize the CPU having the optimal bitwidth specifically customized to perform desired functions.

The present structure for placing a CPU on an ASIC is known as a mega cell. It is called mega, because it is large. This mega cell is a microprocessor, custom designed at the transistor level in a specific ASIC technology. Present mega cell CPUs are actually microprocessors which have been designed with fixed architectures and the CPU bitwidths of 16 bits or 32 bits. Consequently, when the application requires the microprocessors other than 16-bit or 32-bit microprocessors and is moved to a new technology (or even next generation of the current technology), the mega cell must be redesigned. Since the mega cell has been designed at the transistor level, this redesign process is considerably expensive and creates schedule delay.

In view of the aforementioned problems, a system has been desired which is capable of designing the CPU at the level higher than the transistor level.

The special mega cell technology for placing a CPU on an ASIC also creates problems for system simulation and emulation, since the mega cell technology is different from the technology for fabricating the rest of the ASIC.

A module compiler is a tool for automatically creating the layout patterns of modules when the information on the functions of the modules, bit widths, and the like required for creating the layout patterns is supplied as parameters.

FIG. 35 is a block diagram showing the function of a conventional module compiler for creating the layout patterns of modules automatically. It is described on page 60–61, in the book entitled "Basic Concepts and Applications of the ASIC technology" by Masaharu Imai and the Institute of Electronics, Information and Communication Engineers of Japan, the first edition of which was published on Feb. 20, 1994.

As shown in FIG. 35, automatic module generation involves using programmed circuit netlists and programmed layout patterns of RAMs (Random Access Memory), ROM (s) (Read Only Memory), the ALU (Arithmetic Logic Unit), etc., and a technology file storing design rules. In the automatic module generation process which does not depend on a specific design technology, by altering the design technology, various layout patterns of modules can be generated, using the lines of 1.3 μm, 1.0 μm, or 0.8 μm in width. The user should only specifies such parameters as the number of words, the bitwidth, and the like.

Next, a conventional logic synthesis system is described.

FIGS. 36 and 37 are block diagrams showing how the conventional "Tsutsuji" logic synthesis system marketed by Zuken Incorporated is used for generating a netlist.

In FIG. 36, a "Tsutsuji" 850 receives a block diagram 810 prepared by a designer using computer-aided design (CAD) systems, implements logic synthesis, and generates a netlist 860. Based on the generated netlist 860, a semiconductor chip is fabricated.

FIG. 37 shows a case where a hardware description language (HDL) is used instead of a block diagram. The hardware description language (HDL) for the "Tsutsuji" logic synthesis system is written in a logic description format (LDF). The "Tsutsuji" 850 receives an LDF 820, implements logic synthesis, and generates the netlist 860.

In the "Tsutsuji" logic synthesis system, functional components to be designed and used as input data are not necessarily restricted to those of specific manufacturers. The generated netlist can be generated in a format of a specific silicon manufacturer. Consequently, a chip which does not depend on a specific semiconductor technology can be designed.

FIGS. 38 and 39 are block diagrams of the "Retargettable Compiler System" disclosed in Japanese Unexamined Patent Application HEI3-144829.

FIG. 38 is a block diagram showing the overall configuration of the "Retargettable Compiler System".

A compiler 911 comprises syntax analysis means 912, code generation means 913, target specification and recognition means 914, target-dependent information holding means 915, and instructions expressed in an intermediate language 916. The syntax analysis means 912 receives a source program 917 and translates the source program 917 into the instructions expressed in the intermediate language 916 which is independent of a specific computer architecture. The code generation means 913 receives the instructions expressed in the intermediate language 916 and translates the instructions expressed in the intermediate language 916 into an object program 918, targeting the computer architecture recognized by the target specification and recognition means 914 and by referring to the detailed information held in the target-dependent information holding means 915. The detailed information held in the target-dependent information holding means 915 includes data on the hardware configuration and execution characteristics such as the set of machine instructions, types and numbers of registers, the data format, and the addressing system.

FIG. 39 is a block diagram showing an example of how the conventional "Retargettable Compiler System" is used.

As shown in FIG. 39, using a single compiler, the conventional "Retargettable Compiler System" can compile one source program 917 into three object programs 918a, 918b, and 918c for computer architectures 920a, 920b, and 920c respectively.

As a retargettable compiler similar to that described above, the General Purpose C Compiler (GCC) may be pointed out. The General Purpose C Compiler is a C compiler for the GNU (GNU is not UNIX) operating system. GNU refers to the computer software distributed for free by Free Software Foundation, Inc. of the U.S.A. (Refer to page 397 of the "Dictionary of New Information and Communications Terms 1996" by the Nikkei BP Publication Center, the first edition of which was published on Oct. 9, 1995.)

As public-domain software, the lcc compiler prepared by C. W. Fraser of the AT&T Bell Laboratory and D. R. Hanson of the Princeton University may be pointed out. This program is the public-domain software which is available via the Internet. The lcc compiler is a retargettable compiler whereby the instruction code of the existing processor such as SPARC, MIPS, R300, or INTEL 386 can be generated.

The compiler of the above-mentioned type, when supplied with parameters for a target computer, compiles the source program into the object program specifically matched to the architecture of the target computer. The architecture of a computer, for example, may include 8086 manufactured by Intel Corporation, MC68000 manufactured by Motorola, Incorporated, and the like. These compilers target the hardware architecture which has already been fixed. By prestoring detailed information on the fixed hardware architecture into the compiler, retargettable compilation becomes possible. Thus, when a new hardware architecture is to be determined, or a new CPU is to be designed, the compiler for the newly-designed CPU is not readily available.

SUMMARY OF THE INVENTION

The present invention has been made to solve the aforementioned problems. It is, therefore, an object of the present invention to provide a processor synthesis system and a processor synthesis method which enable the synthesis of a processor having high cost efficiency, by supplying such parameters as the CPU bitwidth and the number of registers customized to the requirements of the specific applications.

Furthermore, it is an object of the present invention to provide a processor synthesis system and a processor synthesis method which can reduce the number of software development steps specifically adapted to the processor architecture to be synthesized.

It is a further object of the present invention to provide a processor synthesis system and a processor synthesis method which enable simulation using a program expressed in a programming language which is independent of the processor and the hardware components being designed.

The processor synthesis system according to the present invention comprises:
  (a) a parameter generator for receiving primary parameters, calculating secondary parameters based on the primary parameters, and outputting the secondary parameters; and
  (b) a processor synthesizer for generating and outputting processor definition information to synthesize a processor, according to the secondary parameters generated and output by the parameter generator.

The processor synthesis method according to the present invention comprises steps of:
  (a) receiving primary parameters;
  (b) generating processor definition information according to the primary parameters received so as to synthesize a processor, and outputting the processor definition information.

BRIEF DESCRIPTION OF THE DRAWINGS

The invention will be better understood by reference to the detailed description which follows, taken in connection with the accompanying drawings, in which:

FIG. 10 is a diagram showing an ALU-RR instruction format used in the processor synthesis system according to the present invention;

FIG. 18 is a portion of the program listing the contents of an user parameter file storing the primary parameters according to the processor synthesis system of the present invention;

FIG. 19 is a log list showing an execution record of secondary parameter generation according to the processor synthesis system of the present invention;

FIG. 20 is a log list showing an execution record of secondary parameter generation according to the processor synthesis system of the present invention;

FIG. 21 is a portion of the program showing the contents of an ASAP parameter file generated through the primary parameters and to be input into the processor synthesizer according to the processor synthesis system of the present invention;

FIG. 22 is a portion of the program showing the contents of a compiler parameter file generated through the primary parameters and to be input into an instruction generator according to the processor synthesis system of the present invention;

FIG. 23 is a log list showing the execution record of processor synthesis according to the processor synthesis system of the present invention;

FIG. 24 is a portion of the program listing the contents of an LDF file produced according to the processor synthesis system of the present invention;

FIG. 25 is a log list showing the execution record of assembler generation according to the processor synthesis system of the present invention;

FIG. 27 is a log list showing the execution record of the compiler which has been generated by the processor synthesis system of the present invention;

FIG. 28 is an example of an application program expressed in the C programming language to be input into the compiler which has been generated by the processor synthesis system of the present invention;

FIG. 29 is an example of the program expressed in the assembly language showing an assembly code output by the compiler which has been generated by the processor synthesis system of the present invention;

FIG. 30 is a log list showing the execution record of the assembler which has been generated by the processor synthesis system of the present invention;

FIG. 31 is a list showing an instruction code expressed in the machine language and output by the assembler which has been generated by the processor synthesis system of the present invention;

FIG. 33 is a table comparing the functions of an ASAP synthesized by the processor synthesis system of the present invention and a conventional mega cell;

FIG. 34 is a diagram for comparing the size of a chip using the ASAP synthesized by the processor synthesis system of the present invention and the size of a chip using an existing CPU;

DETAILED DESCRIPTION OF PREFERRED EMBODIMENTS

Embodiment 1

In the following preferred embodiments, a description is directed to a case where the aforementioned "Tsutsuji" logic synthesis system is used. However, another logic synthesis system may be used alternatively. While a high-level C programming language is used for expressing the application software of the processor, other languages may also be used.

Hereinafter, a processor synthesized by a processor synthesis system and a processor synthesis method according to the present invention is defined as the ASAP. While on the other hand, the processor synthesis system according to the present invention is defined as the ASAP synthesis system.

Now, the ASAP synthesis system is outlined. The ASAP (Application Specific Adaptable Processor) synthesis system is a high-level logic synthesis extension to the "Tsutsuji" logic synthesis system. The ASAP is a system for synthesizing CPUs according to primary parameters supplied by the designer. The primary parameters for synthesizing the CPUs include the CPU bit width, the number of registers in the register file, the data memory size and the instruction memory size. All of these primary parameters have a direct effect on the cost of the processor to be synthesized.

The processor according to the present invention is synthesized using the same technology as that for implementing the ASIC. Other peripherals excepting the processor on a semiconductor chip according to the present invention are also synthesized in the ASIC technology. Consequently, simulation is facilitated. As described above, since the processor is also synthesized in the same technology as that for implementing the ASIC, the problem of portability to other technologies is eliminated. In the processor according to the present invention, the CPU bit width is customized to the requirements of the application. Thus, maximum cost efficiency is obtained. For example, when an 11-bit processor is required for a predetermined application, an 11-bit processor is synthesized instead of a 16-bit or 32-bit processor which would be the only option when a mega cell is used for placing the processor.

Figure 1:
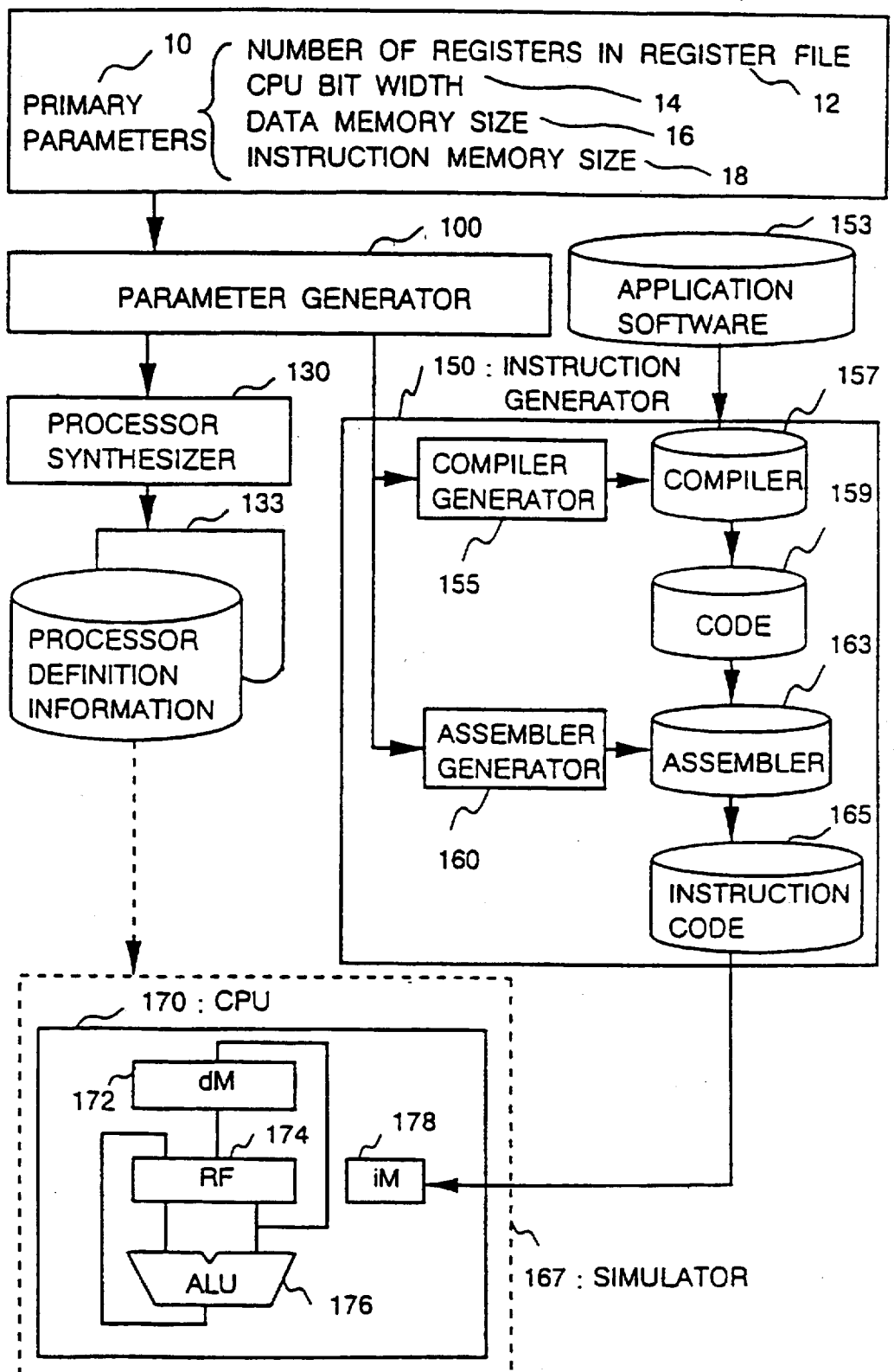
FIG. 1 is a block diagram showing a processor synthesis system according to the present invention.

FIG. 1 is a block diagram showing a processor synthesis system according to the present invention.

A parameter generator 100 receives primary parameters 10 and generates and supplies secondary parameters to a processor synthesizer 130. The primary parameters to be received include the number of registers indicated by reference numeral 12 in a register file 174, a CPU bit width 14, a data memory size 16, and an instruction memory size 18. The processor synthesizer 130 generates processor definition information 133 according to the secondary parameters generated by the parameter generator 100 and outputs the processor definition information 133. The output processor definition information 133 is expressed in a hardware definition language such as, for example, the Logic Description Format (LDF) used in the "Tsutsuji" logic synthesis system. The output processor definition information 133 is supplied to the "Tsutsuji" logic synthesis system (not shown in FIG. 1) and used for generating a netlist. The processor definition information 133 to be supplied from processor synthesizer 130 includes data for defining the CPU to be synthesized. The CPU 170 comprises a data memory 172, the register file 174 comprising a plurality of registers, an Arithmetic Logic Unit (ALU) 176 and an instruction memory 178.

An instruction generator 150 comprises a compiler generator 155 and an assembler generator 160. The compiler generator 155 generates a compiler 157 for the processor definition information which has been generated according to the secondary parameters generated by the parameter generator 100 and supplied from the processor synthesizer 130. The assembler generator 160 generates an assembler 163 for the processor definition information 133 which has been generated according to the secondary parameters generated by the parameter generator 100 and supplied from the processor synthesizer 130.

When an application software 153 expressed in the high-level C programming language is supplied to the generated compiler 157, compilation is implemented, and a code 159 which is written in an intermediate language is produced. The produced code 159 is supplied to the assembler 163 and assembled. Then, an instruction code 165 expressed in a machine language is produced. The produced instruction code 165 is held in the instruction memory 178 of the CPU 170 which has been generated based on the processor definition information 133, and executed.

The processor synthesis system according to the present invention further comprises a simulator 167. Before actually fabricating the CPU, the simulator 167 can implement simulation using the produced instruction code. By altering primary parameters and rewriting the application software according to the simulation result, designers can optimize the processor to be synthesized.

Figure 2:
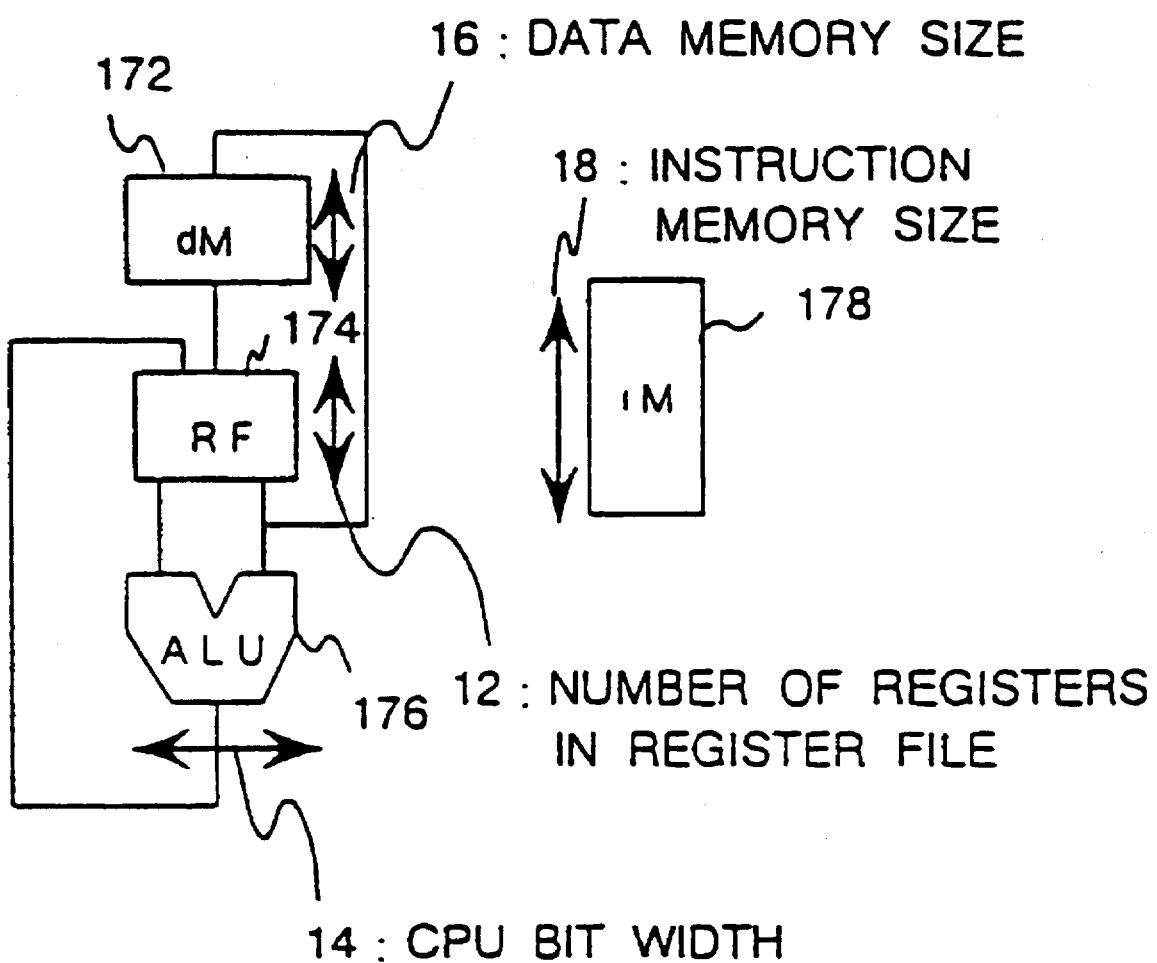
FIG. 2 is a block diagram showing the details of primary parameters used in the processor synthesis system according to the present invention.

FIG. 2 is a block diagram showing the details of the primary parameters 10.

The primary parameters to be supplied to the parameter generator include the number of registers indicated by reference numeral 12 in the register file 174, the CPU bit width 14 which is a bit width of the ALU 176, the data memory size 16 which is a bit width of the data memory 172, and the instruction memory size 18 which is a bit width of the instruction memory 178.

Figure 3:
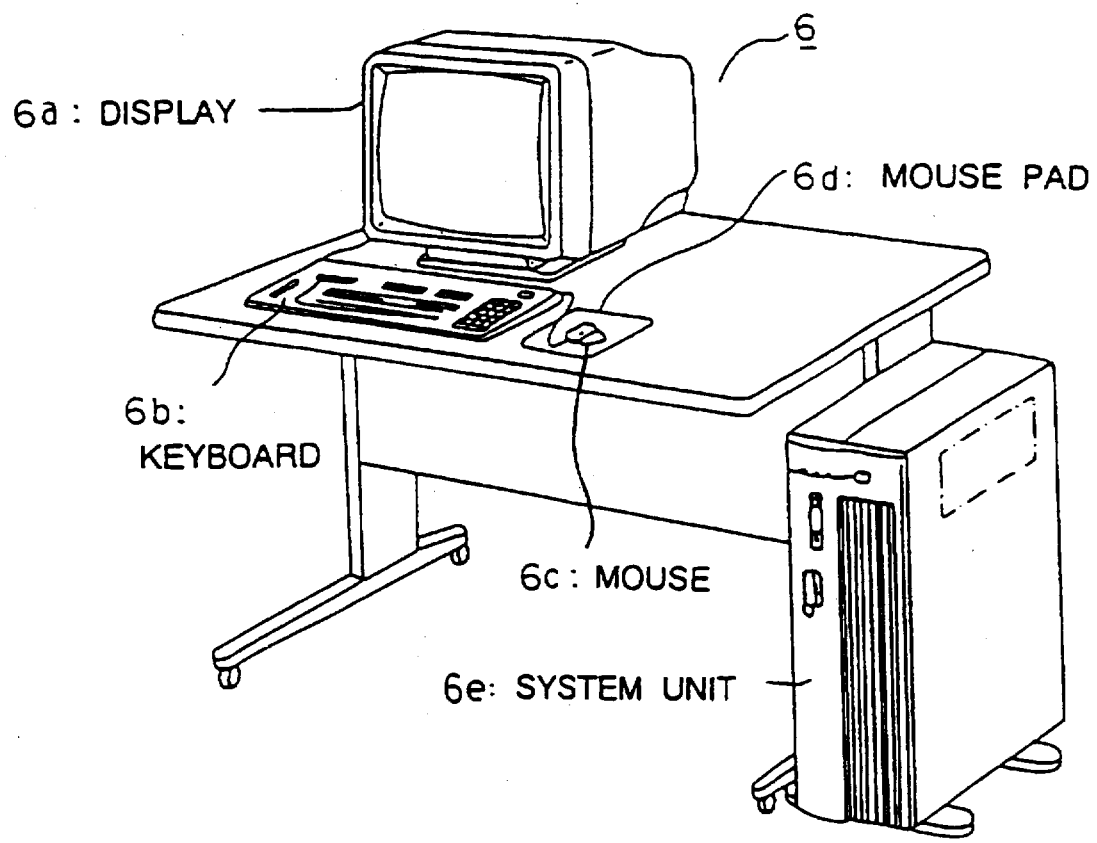
FIG. 3 is a perspective view showing a configuration of the system's hardware on which the processor synthesis system according to the present invention operates.

FIG. 3 is a perspective view showing a configuration of the system's hardware on which the processor synthesis system according to the present invention operates. A computer system 6 comprises a display 6a, a keyboard 6b, a mouse 6c, a mouse pad 6d, and a system unit 6e.

As described hereinbefore, in order to promote high-level design and consistency in the expression of algorithms, the ASAP synthesis system has the compiler generator for the C programming language. Since a conventional processor has only one hardware configuration for specifying the instruction format and the number of registers, only a single compiler for a predetermined programming language is required. With the ASAP, a plurality of the CPU variations can be synthesized, based on the same "basic architecture" which will be hereinafter described. Consequently, the compiler generator for providing a compiler that matches the synthesized CPU is necessary. The compiler generator receives the same parameters as the processor synthesizer 130 shown in FIG. 1. Then, the application software is compiled by the generated C Compiler and the resultant machine-level instructions are finally loaded into the instruction memory of the synthesized processor.

Figure 4:
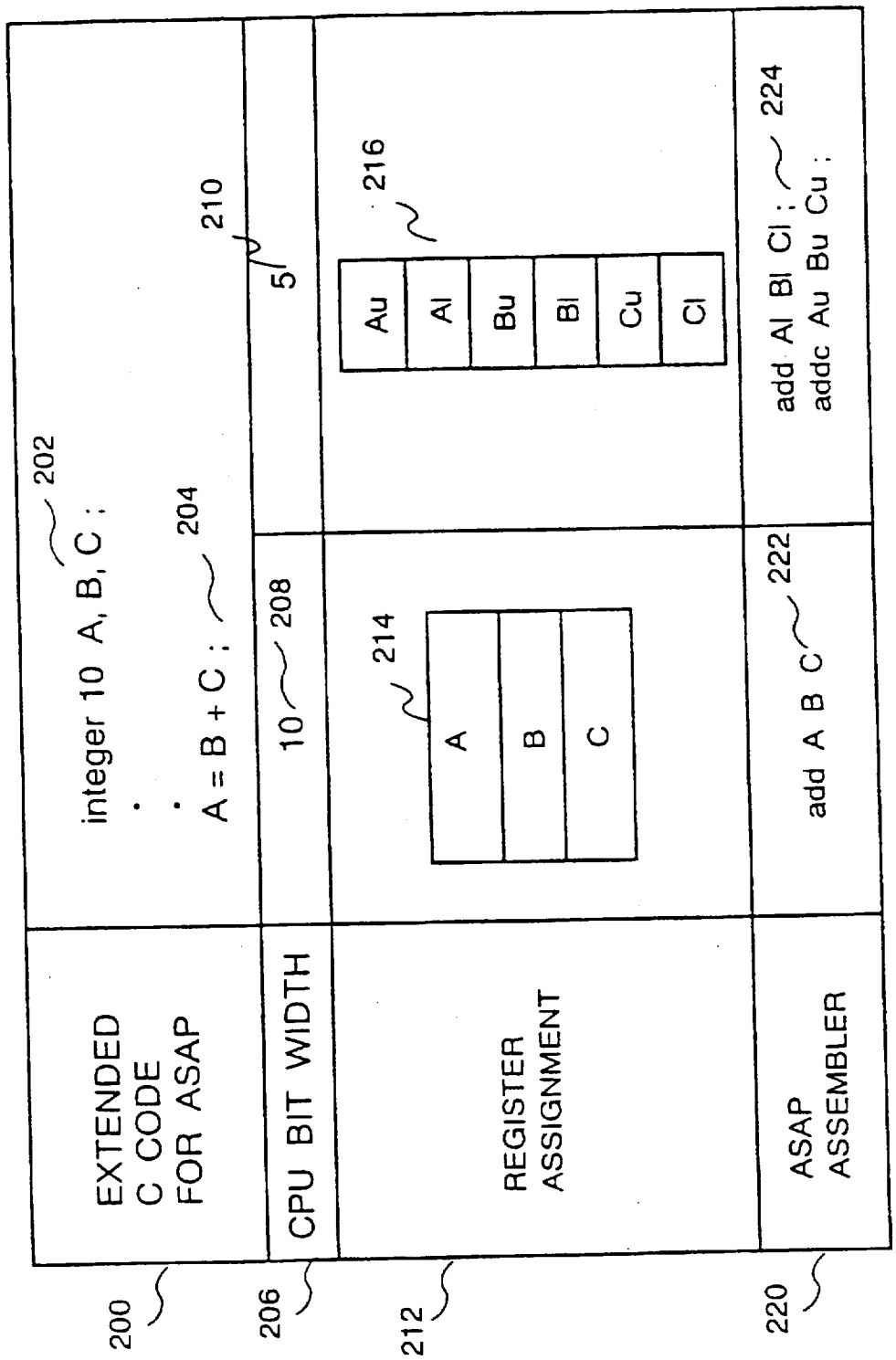
FIG. 4 is a table giving an example of instruction generation by a C compiler in accordance with the required precision depending on the CPU bit width.

The C Compiler adapts the application software to the CPU according to the secondary parameters. As shown in FIG. 4, in the case of a 10-bit CPU, when a 10-bit variable is used in the program expressed in the extended C programming language for the ASAP, the register bit width also becomes 10 bits and an instruction will become a single-precision instruction. On the other hand, in the case of a 5-bit CPU, the register bit width becomes 5 bits, and an instruction will become a double precision instruction into which a carry is added.

Now, "the basic architecture" of a processor according to the present invention will be described.

ASAP is a RISC architecture computer. Each machine instruction is a single word in the instruction memory. It is assumed herein that the instruction memory and the data memory have different bit widths. All instructions are executed in one clock cycle. Single-cycle instruction execution is achieved by separating the data and instruction memories and having a register file with two read ports and one write port.

I/O

Input/Output is memory mapped. By writing data to a certain address in the data memory, the data is loaded into the output register (not shown) of the output port (not shown) of the CPU instead of the data memory. By reading data from certain locations in the data memory, the data is read from the input port (not shown) of the CPU.

Operand Addressing

ALU operands are held in the register file and addressed by their register number assigned. However, in this case, Short Immediate operands are excluded. The Short Immediate operands are identified in the Short Immediate operand field of the instruction word. Generally, the bit width of the Short Immediate operand field will be shorter than a word in the data memory. The function of Short Immediate operands is to increment and decrement the value of the data memory pointers by small fixed amounts.

Data Memory Addressing

The data memory is addressed directly or indirectly. When the data memory is addressed directly, the address is supplied by the instruction word. When the data memory is addressed indirectly, the data memory is addressed by the value held in a register in the register file. Let us assume that n is the number of bits in a register file word. Then, when the size of the data memory is larger than $2^n$ words, an optional data memory address register will be synthesized. The synthesized optional data memory address register holds the upper bits of the address. The upper bits held must be loaded from the register file first.

Instruction Memory Addressing

The instruction memory is addressed by the program counter register in the program counter. The program counter modifies the value of the program counter register in one of several ways so as to alter the flow of the program. Normally, the program counter contains the next sequential address. The next sequential address is computed by the program counter adder by adding 1 to the present address.

A relative branch address can be computed by the above-mentioned program counter adder by adding a portion of the instruction word to the present address. The value added to the present address is positive or negative. When the value is positive, the address is added and branched forward (in a forward direction to the addressing sequence). When the value is negative, the address is subtracted and branched backward (in a direction opposite to the addressing sequence).

When a direct jump is accomplished, the current value of the program counter is replaced entirely by a value specified in the address portion of the instruction word.

A jump can also be accomplished by directly loading into the program counter the value of a register in the register file. This type of jump is referred to as an indirect jump. Now, we will assume that n is the number of bits in a register file word. Then, when the size of the instruction memory is larger than $2^n$ words, an optional instruction memory address register will be synthesized. The synthesized instruction memory address register will hold the upper bits of the address. The upper bits of the address held must be loaded from the register file first.

Next, the ASAP hardware will be described.

Figure 5:
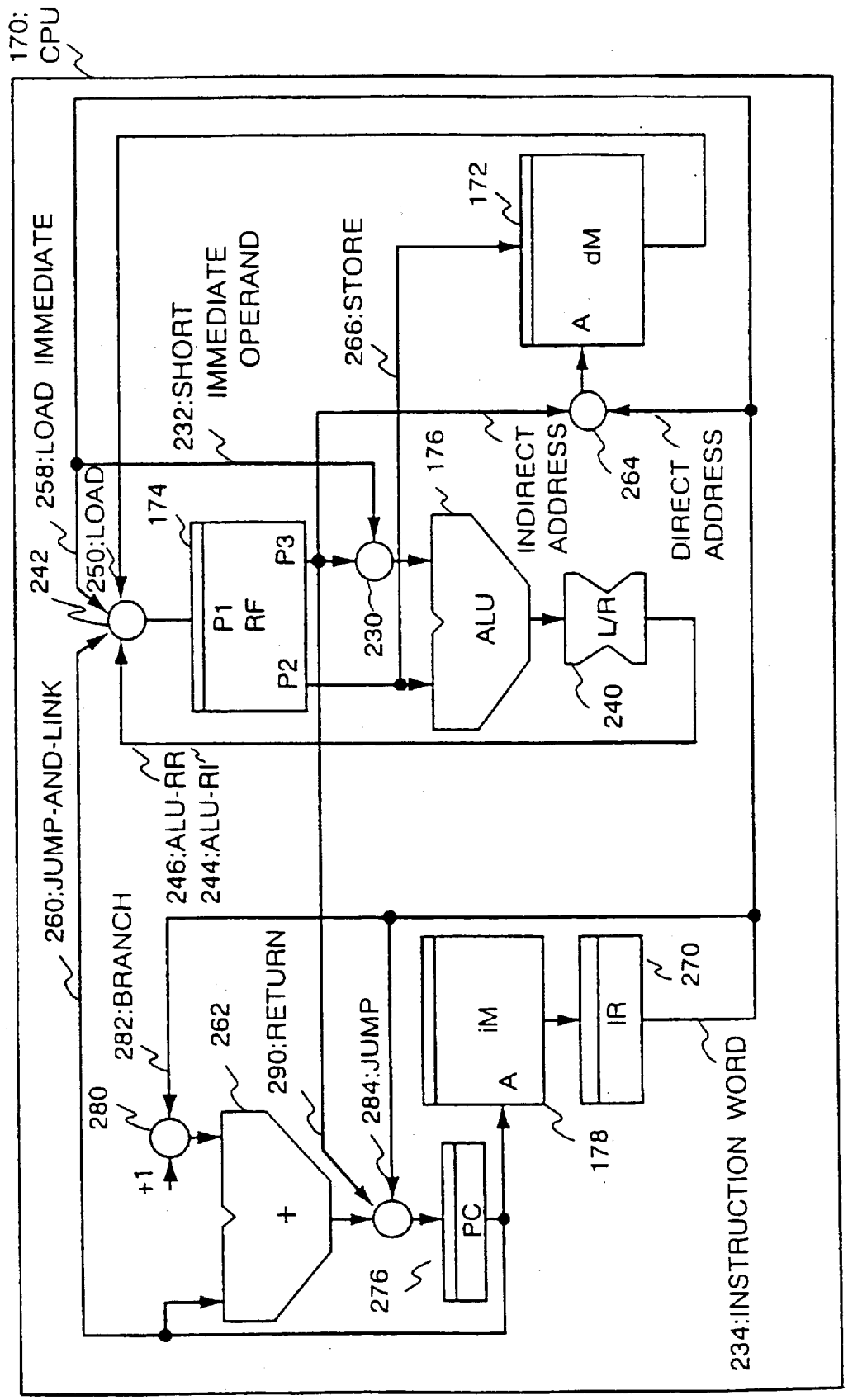
FIG. 5 is a block diagram showing the functions of a processor synthesized by the processor synthesis system according to the present invention.

FIG. 5 is a block diagram showing the functions of an ASAP processor.

In FIG. 5, the details of the control logic and the data bus subdivisions are not shown.

ALU

In FIG. 5, the Arithmetic Logic Unit (ALU) 176 normally receives two operands from the register file 174. The first operand input receives the first operand from the register file. The second operand input is connected to an ALU second operand multiplexer 230. The ALU second operand multiplexer 230 selects either an operand held in a register file 174 or a Short Immediate operand 232 supplied from the instruction word. The Short Immediate operand 232 is two's complement number and its sign is extended according to the bit width of the ALU 176.

The functions of the ALU 176 include addition, subtraction, arithmetic compare, bitwise OR, bitwise AND, bitwise XOR, and bitwise compare. Multi precision operations are implemented by a setting a carry flag. The carry flag (not shown) is used as an optional carry input to the ALU. The carry input is controlled by the microcontrol field of the instruction word.

Shifter

A shifter 240 labeled as L/R in FIG. 5 is connected to the output of the ALU. The shifter 240 implements arithmetic and logical single-bit left/right shift operations. The shifter 240 also implements logical single-bit left/right rotation. Multiple precision shifts can also be implemented through a shift extension flip-flop. The shift function is controlled by the microcontrol field of the instruction word. The output of the shifter 240 is supplied to a register file data input selector 242.

Register File Data Input Selector

Data to be written into the register file 174 has four sources, and the operation code (Op code) determines which one of the four sources is selected. The register file data input selector 242 selects the output of the shifter 240 when an ALU-RI (ALU-Register-Immediate)instruction 244 and an ALU-RR (ALU-Register-Register) instruction 246 are to be executed. When Load Direct or Load Indirect instructions 250 are to be executed, the register file data input selector 242 selects the output of the data memory. When a Load-Immediate instruction 258 is to be executed, the register file data input selector 242 selects the immediate data field of the instruction word. Finally, when a Jump-and-Link instruction 260 is to be executed, the register file data input selector 242 selects the output of a program counter adder 262. Consequently, the value of the current instruction address plus 1 is stored in the register file 174.

Register File

The number of registers in the register file 174 abbreviated to RF in FIG. 5 is determined by primary parameters. The bit width of the register file 174 is calculated from the primary parameters and determined as one of secondary parameters. The register file 174 has two read ports P2 and P3, and one write port P1. All of these ports are independent and can be used simultaneously.

The write port P1 receives data from the register file data input selector 242. The read ports P2 and P3 are connected to the ALU 176. The first read port P2 is directly connected to the ALU 176. The second read port P3 is connected to the ALU 176 via the ALU second operand multiplexer 230. The first read port P2 is connected to the branch condition test circuit (not shown). Consequently, the contents of each register can be tested for various conditions including zero, positive, negative, odd, and even. The second read port P3 is connected through the ALU second operand multiplexer 230 to the data memory address multiplexer 264.

The register file addresses come from an instruction register 270. The three fields are labeled as d (destination), s1 (source 1), and s2 (source 2). The d-field controls the write port, while the s1-field and s2-field control the read ports. The address of the first read port P2 comes from the multiplexer (not shown) connected both to the d-field and the s2-field. Thus, the data memory address can occupies the same field of the instruction word as a data-loading address for a Load instruction or a data-storing address for a Store instruction.

Program Counter Register

A program counter register 276 abbreviated to PC in FIG. 5 supplies the instruction memory 178 with the address of the next instruction to be executed. The program counter register 276 receives its next value from one of the following sources:

(0) the second read port P3 of the register file 174

(1) a program counter adder 262

(2) the jump address field of the instruction register 270

The program counter register 276 is connected to the second read port P3 of the register file 174. Consequently, the program can be returned from a subroutine. Nested subroutine return addresses are held in a stack which is managed by the compiler.

The program counter register 276 is connected to the program counter adder 262. Consequently, the next sequential address can be supplied. The second operand of the program counter adder 262 is connected to a multiplexer 280. The multiplexer 280 selects either the constant 1 used to increment the value of the program counter register 276 or the value of the branch displacement field of the instruction register 270 used to calculate a relative branch address. The branch displacement field is two's complement number. Thus, the relative branch can be taken either forward or backward according to the current value of the program counter register 276.

The connection of the program counter register 276 to the jump address field of the instruction register 270 enables the execution of the Jump instruction.

Instruction Register

The instruction register 270 is a pipeline register for the instruction word which is read from the instruction memory 178. By placing a pipeline register in this path, the clock cycle time delay of the instruction memory 178 can be reduced.

A cycle delay in this path means that when a Jump instruction is in the instruction register 270, the program counter register 276 is pointing to one instruction after the current Jump instruction. This instruction after the current Jump instruction will next appear in the instruction register. Then, the jumped-to instruction jumped by the Jump instruction will appear in the instruction register on the next cycle. This "dead space" generated by the Jump instruction (the instruction immediately after the Jump instruction) can be removed in the following two ways:

1. moving an instruction which is not contained within a local loop to the location immediately after the Jump instruction by means of the compiler,
2. placing a No Operation instruction in the location immediately after the Jump instruction if a movable instruction which is not contained within a local loop is not available.

Instruction Memory

The function of the instruction memory abbreviated to iM in FIG. 5 is to hold the application program for the ASAP. The bit width of the instruction memory has an effect on all of the secondary parameters. The size of the instruction memory or the number of words of the instruction memory is one of the primary parameters.

Data Memory

The function of the data memory abbreviated to dM in FIG. 5 is to hold the variables and data for the application program. The data memory is a writable memory. The bit width of the data memory is determined by the CPU bitwidth which is one of the primary parameters. The number of words to be stored is determined by the data memory size which is also one of the primary parameters.

The data memory address comes from the data memory address multiplexer 264. The data memory address multiplexer 264 selects either the output of the instruction register 270 or the output of the second read port P3 (s2-field) of the register file 174. The data input to the data memory is connected to the first read port P2 of the register file 174, while the data output from the data memory is supplied to the register file data input selector 242.

Next, a description is directed to the instruction set.

Figure 6:
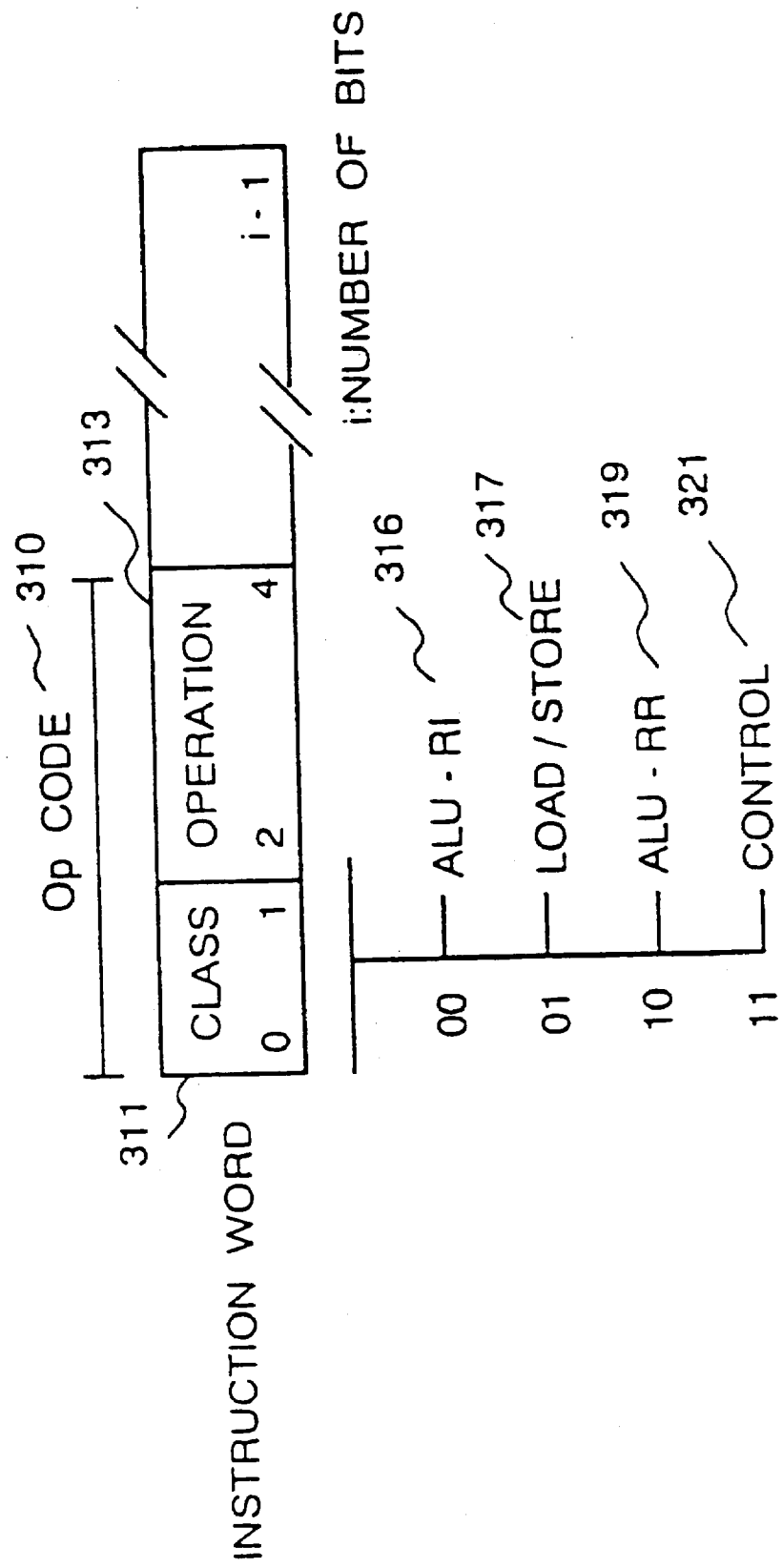
FIG. 6 is a diagram showing the Op code field of an instruction word used in the processor synthesis system according to the present invention.

FIG. 6 is a diagram showing the Op code field of an instruction word.

In the diagrams showing the Op code field of an instruction word, the number of bits in an instruction word is indicated by i. While the most significant bit is bit 0, the least significant bit is bit i-1. This rule is also applied to data words and address busses.

The first two bits (the most significant two bits: 0, 1) of the instruction word are decoded to provide following four general classes of instructions:

(0) ALU-Register-Immediate (ALU-RI),
(1) Load/Store,
(2) ALU-Register-Register (ALU-RR), and
(3) Control.

The three bits (2,3,4) following the most significant two bits of the instruction word determines the operation within each category.

The last four bits (the least significant four bits: i-4, i-3, i-2, i-1) of the instruction word are used as a microcontrol field.

Figure 7:
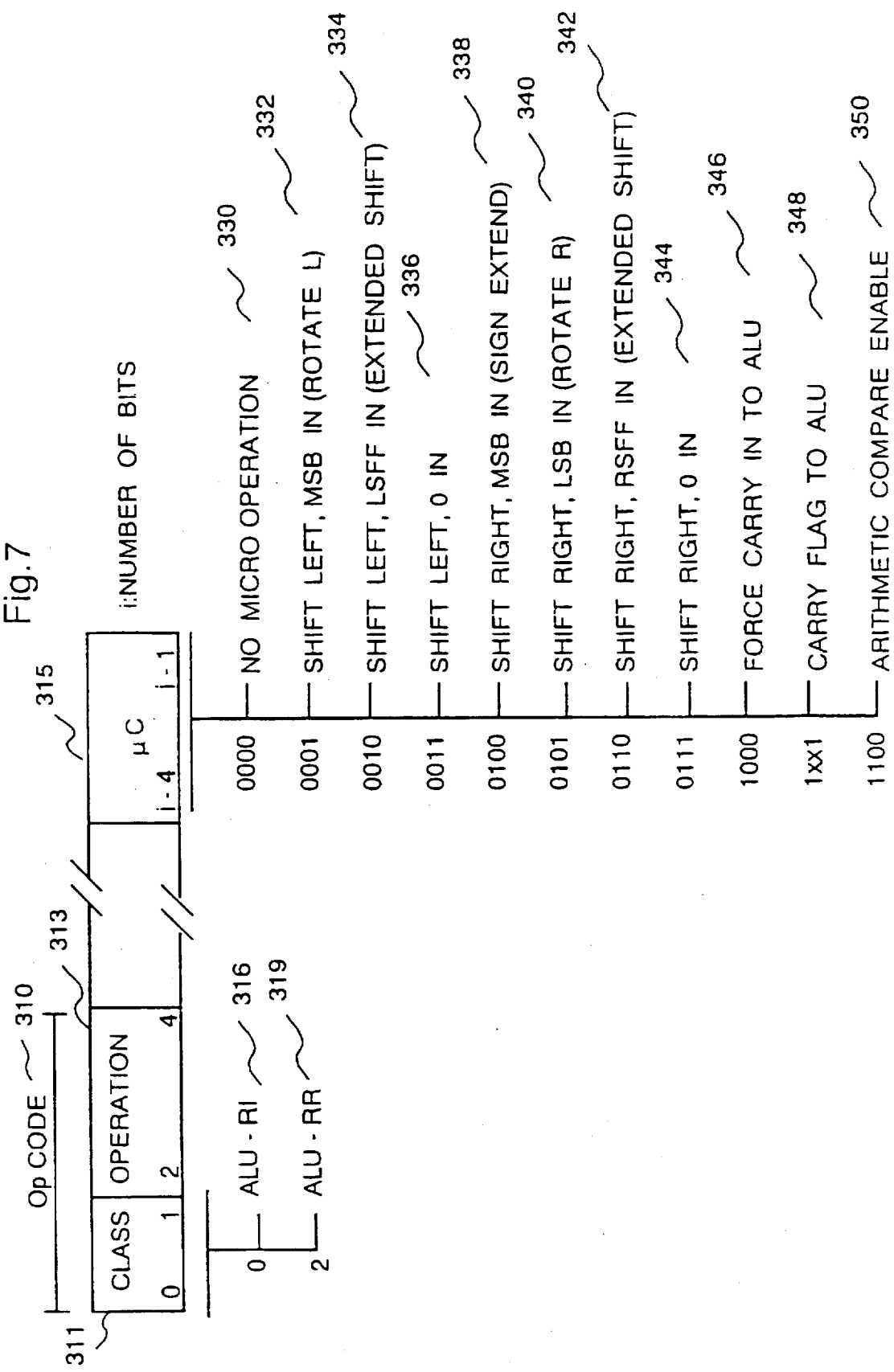
FIG. 7 is a diagram showing the microcontrol field of an instruction word used in the processor synthesis system according to the present invention.

FIG. 7 is a diagram showing the microcontrol field of an instruction word.

The microcontrol field controls the shifter and the carry input to the ALU, and determines the details of the two classes of ALU instructions.

The size of the fields (the number of bits) in the middle of the instruction word varies depending on the secondary parameters.

ALU-Register-Immediate

In the ALU-RI class of instructions, one operand comes from the register file, and the other operand is a Short Immediate operand which is specified in the Short Immediate operand field of the instruction word. The length (bit width) of the Short Immediate operand field is the length between the microcontrol field and the s1-field. For the ALU-RR class of instructions, for example, the length of the Short Immediate operand field is the length of the s2-field.

Figure 8:
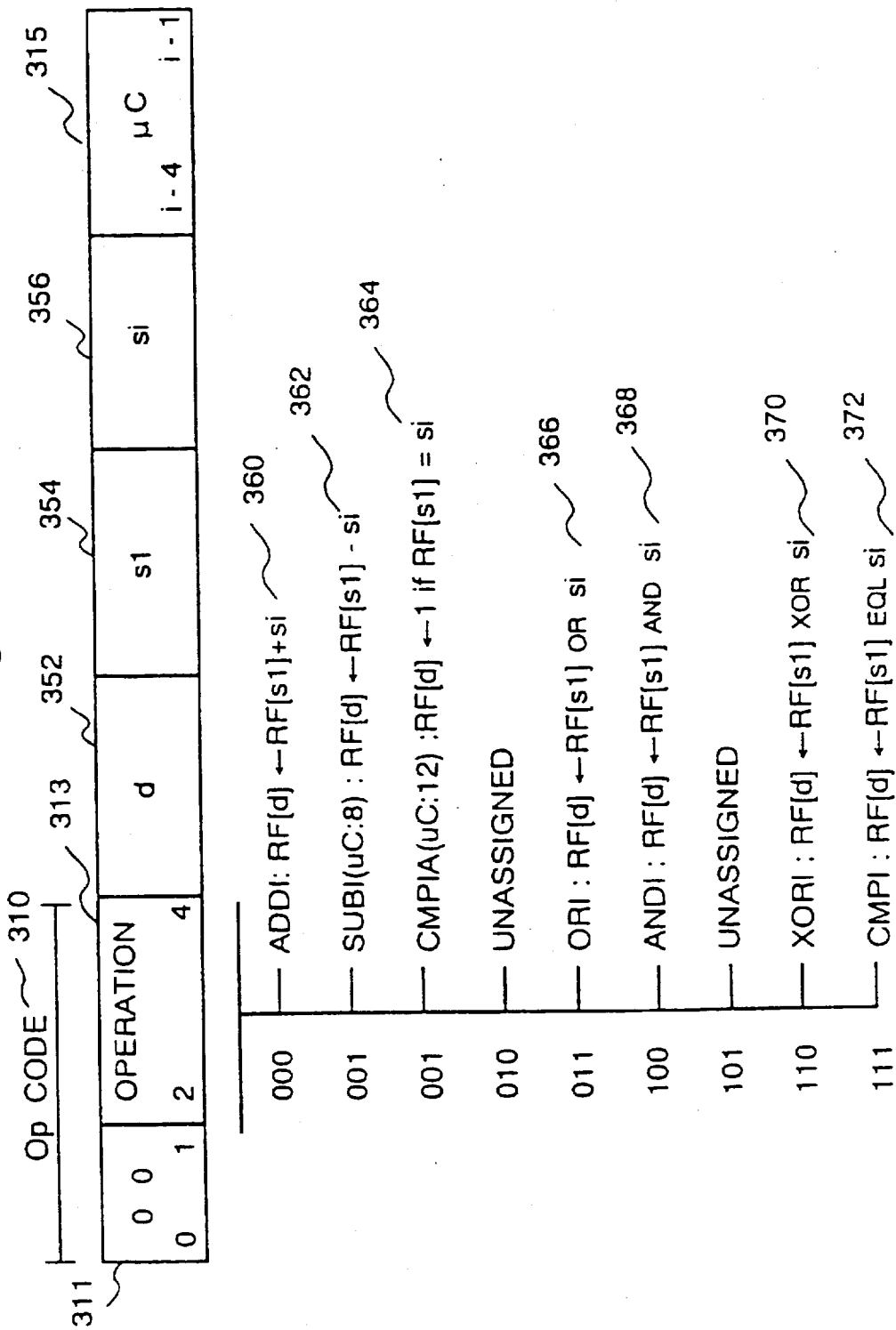
FIG. 8 is a diagram showing an ALU-RI instruction format used in the processor synthesis system according to the present invention.

FIG. 8 is a diagram showing an ALU-RI instruction format.

The three bits (2,3,4) following the most significant two bits are decoded to provide the following operations:

(0) Add Immediate,
(1) Subtract Immediate or Compare Immediate Arithmetic,
(2) unassigned,
(3) Or Immediate,
(4) And Immediate,
(5) unassigned,
(6) Xor Immediate,
(7) Compare Immediate.

Operations (3) through (7) are bitwise logical operations. The Add and Subtract operations are two's complement arithmetic operations and will set the carry flag if a carry-out occurs from the ALU. The Short Immediate operand field si is sign-extended to match the word size of the CPU regardless of the fact whether the operation is arithmetic or logical.

Load/Store

The Load/Store class of instructions deal with data movement between the data memory and the register file. "Load" refers to writing data from the data memory into the register file, while "Store" refers to writing data from the register file into the data memory.

Figure 9:
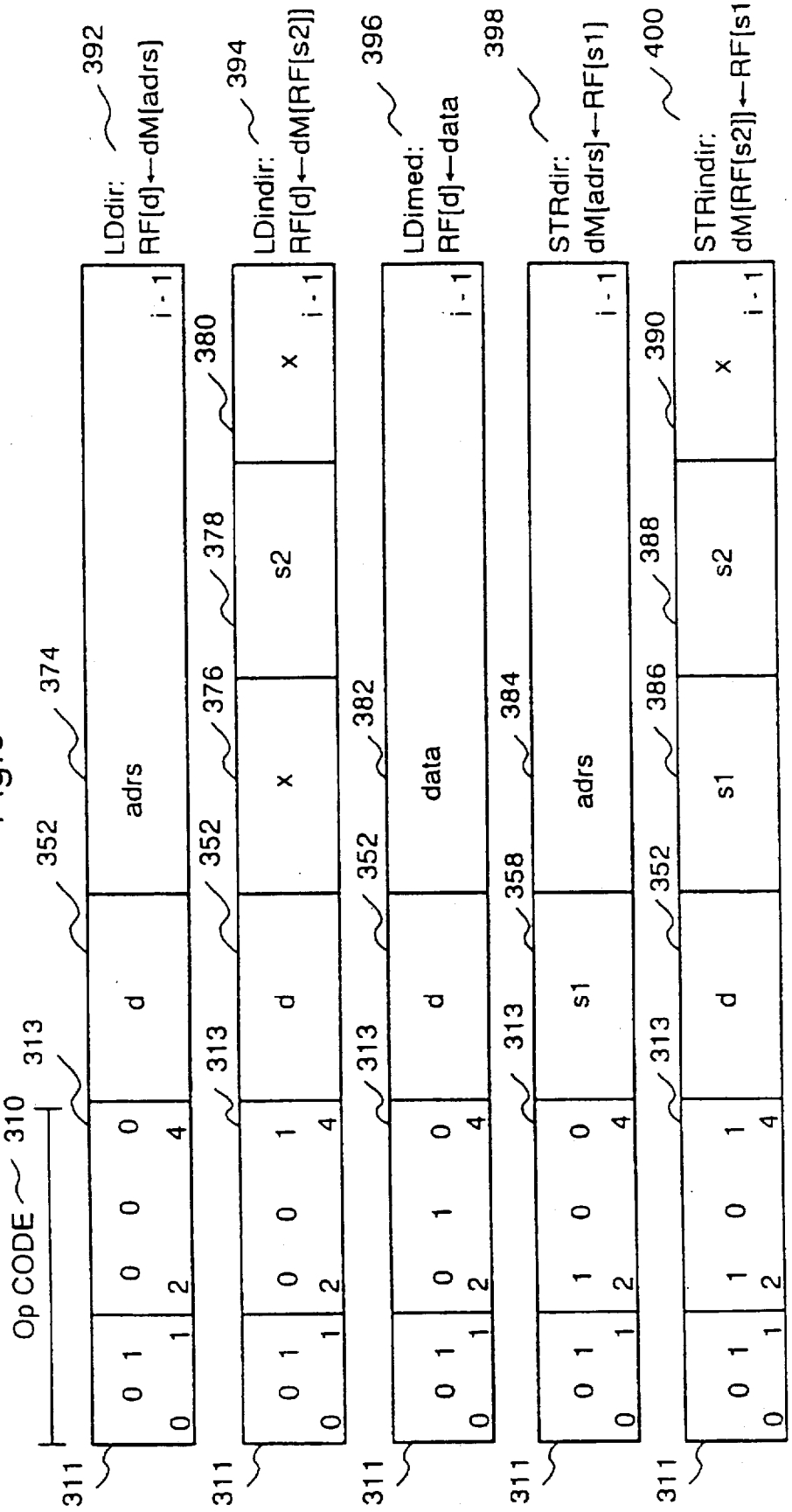
FIG. 9 is a diagram showing Load/Store instruction formats used in the processor synthesis system according to the present invention.

FIG. 9 shows Load/Store instruction formats.

The three bits (2, 3, 4) following the most significant two bits are decoded to provide the following operations:

(0) Load Direct,
(1) Load Indirect,
(2) Load Immediate,
(3) unassigned,
(4) Store Direct,
(5) Store Indirect,
(6) unassigned,
(7) unassigned.

"Direct" means that a data memory address is supplied by the instruction word, while "Indirect" means that a data memory address is supplied from the register file. In the Load Immediate instruction, the data operand is supplied by the instruction word.

ALU-Register-Register

In the ALU-RR class of instructions, both operands used for this operation come from the register file, and the result of the operation is written back into the register file.

FIG. 10 shows an ALU-RR instruction format.

The three bits (2, 3, 4) following the most significant bits are decoded to provide the following operations:

(0) Add,
(1) Subtract or Compare Arithmetic,
(2) unassigned,
(3) Or,
(4) And,
(5) unassigned, (6) Xor,
(7) Compare.

Operations from (3) through (7) are bitwise logical operations. The Add and Subtract operations are two's complement arithmetic operations, and will set the carry flag if a carry-out occurs from the ALU.

Control

Figure 11:
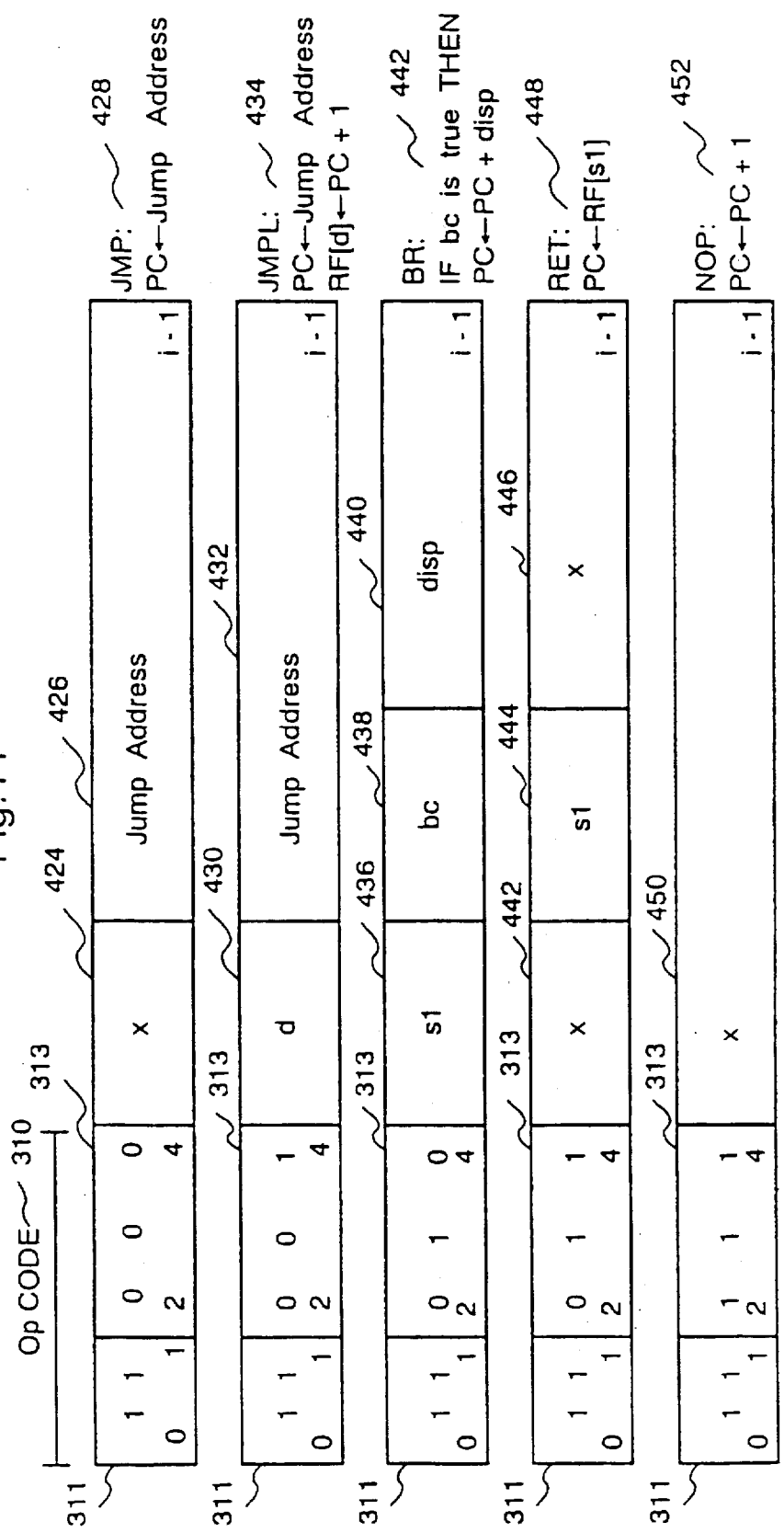
FIG. 11 is a diagram showing Control instruction formats used in the processor synthesis system according to the present invention.

The control class of instructions alters the program flow. FIG. 11 shows control instruction formats.

The three bits (2, 3, 4) following the most significant two bits are decoded to provide the following operations:

(0) Jump,
(1) Jump-and-Link,
(2) Branch,
(3) Return,
(4) unassigned,
(5) unassigned,
(6) unassigned,
(7) No Operation.

A Jump instruction changes the program address sequencing unconditionally. When a Jump instruction is executed, the contents of the jump address field of the instruction word are transferred to the program counter register.

A Jump-and-Link instruction also changes the program address sequencing unconditionally. However, when this instruction is executed, the incremented value of the program counter is stored in the register file. The storage location within the register file is specified in the d-field. This instruction is used for jumping to a subroutine. By storing the address of the instruction following the Jump-and-Link instruction, the program can return to the main sequence of the instruction flow after the subroutine has been executed. Nested subroutines use a software mechanism known as a stack to manage the return addresses. The action of the stack is controlled by the compiler.

The Branch group of instructions extends the Op code by four-bit value of the branch condition field (bc) which follows the d-/s1-field and which is to the right of the d-/s1-field in FIG. 11. The field following the Op code would normally be the d-field, and selects the address to be written into the register file. In the case of some of the branch group of instructions, their actions are determined by the status of a register specified in the s1-field. In this case, the multiplexer (not shown) connected to the first read port P2 of the register file is used for supplying from the d-/s1-field the address to be read by the register file.

The remaining bits in the instruction can be used as the branch displacement field showing a two's complement branch displacement. When the branch conditions are met, the branch is "taken" and the branch displacement is added to the program counter. Consequently, the address of the next instruction is determined.

The four-bit branch condition field, which is abbreviated to bc in FIG. 11 is decoded as follows:

The most significant bit (the first bit) of the branch condition field determines the sense of the condition which is determined by decoding the least significant three bits. When the most significant bit is zero, the true sense of the condition is tested. When the most significant bit is 1, the inverse sense of the condition (whether the sense of the condition is false) is tested.

When all of the bits are 0, for example, the instruction tests whether the value of a particular register in the register file is zero. If the value is zero, the branch is taken. When the most significant bit of the branch condition field is 1, the sense of the instruction is inverted. In this example, the instruction tests whether the value of a register is not zero. Then, if the value of the register tested is not zero, the branch is taken.

The three least significant bits of the branch condition field are decoded to show the following:

(0) Branch if the value of a register specified by the d-/s1-field is zero,
(1) Branch if the ALU carry flag is set,
(2) Branch if the value of a register specified by the d-/s1-field is odd,
(3) Branch if the value of a register specified by the d-/s1-field is negative,
(4) Branch if the value of the external input-4 (not shown) is true,
(5) Branch if the value of the external input-5 (not shown) is true,
(6) Branch if the value of the external input-6 (not shown) is true,
(7) Branch if the value of the external input-7 (not shown) is true.

A Return instruction transfers the value of a register in the register file specified by the s1-field to the program counter register. By means of this Return instruction, the program can return to the main sequence of the instruction flow from a subroutine.

A No Operation instruction does not change the machine state, though it changes the contents of the program counter.

Next, a description will be directed to the ASAP synthesis system.

The ASAP synthesis system according to this embodiment is built within the framework of the "Tsutsuji" logic synthesis system. The program for synthesizing the processor is written in the LDF (Logic Description Format). LDF is a language for logic description and is used in the "Tsutsuji" logic synthesis system. The "Tsutsuji" logic synthesis system was previously marketed by Yokogawa Hewlett-Packard Ltd. and is now marketed by Zuken Incorporated.

The primary parameters determine the configuration, cost, and performance of the CPU. The primary parameters are the CPU bit width, the number of registers in the register file, the data memory size, and the instruction memory size.

Next, the secondary parameters respectively given by the individual primary parameters will be described in detail.

The CPU Bit Width

This primary parameter determines the data word size of the ASAP. According to the determined data word size, the word size for single precision operations of the compiler generator is determined. This primary parameter affects the bit widths of the register file, the ALU, the shifter, the data memory, and the Immediate data field of the Load Immediate instruction.

The Number of Registers in the Register File

This primary parameter determines the size of the d-field, the s1-field, or the s2-field in the instruction word. It also indirectly determines the size of the Short Immediate operand, because the s2-field is replaced by the Short Immediate operand in the ALU-RI class of instructions. The size of the field is calculated by the following equation:

$$W_r = \text{ceiling} (\log_2 N_R)$$

where, $W_r$ is the bit width of the d-field, the s-1 field, or the s2-field in the instruction word, and $N_R$ is the number of registers in the register file. Assuming that $N_R$ is 12, for example, $\log_2 12$ is approximately 3.58 and the integer which is closest to 3.58 is 4. Consequently, the bit width of the d-field, the s-1 field, or the s2-field is determined to be four bits.

The Data Memory Size

This primary parameter determines the size of the address field in the Load Direct and Store Direct instructions. Then, the width of the data memory address multiplexer is also determined. The size of the address field is calculated by the following equation:

$$W_a = \text{ceiling}(\log_2 N_D)$$

where, $W_a$ is the bit width of the address field in the instruction word, and $N_D$ is the number of words in the data memory.

When the size of the data memory is larger than $2_n$ words and n is assumed to be the number of bits in a register file word, an optional data memory address register is synthesized so as to hold the upper bits of the address of data. The upper bits of the address held in the optional data memory address register must be loaded from the register file first.

The Instruction Memory Size

This primary parameter determines the size of the jump address field in the Jump and Jump-and-Link instructions. Then, the widths of the program counter register and its associated components are determined. The size of the jump address field is calculated by the following equation:

$$W_j = \text{ceiling}(\log_2 N_I)$$

where $W_j$ is the bit width of the jump address field in the instruction word, and $N_I$ is the number of words in the instruction memory.

When the size of the instruction memory is larger than $2_n$ words and n is assumed to be the number of bits in a register file word, an optional instruction memory address register is synthesized so as to hold the upper bits of the instruction address. The upper bits of the instruction address must be loaded from the register file first.

The number of bits in the instruction word is calculated by the following equation:

$$W_I = K_0 + \max((K_u + 3W_r), (W_r + W_a), (W_r + W_j), (W_r + W_c))$$

where $K_0 = 5$ is the bit width of the Op code field, $K_u = 4$ is the bit width of the microcontrol field, and $W_c$ is the CPU bit width.

The above equation shows that the number of bits in the instruction word is determined by adding the bit width of the Op code field to the maximum among the sum of the bit width of the microcontrol field and three times the bit width of the register address field, the sum of the bit width of the register address field and the bit width of the instruction address field, the sum of the bit width of the register address field and the bit width of the jump address field, and the sum of the bit width of the register address field and the CPU bit width.

Embodiment 2

Next, a processor synthesis method according to the present invention will be described.

Figure 12:
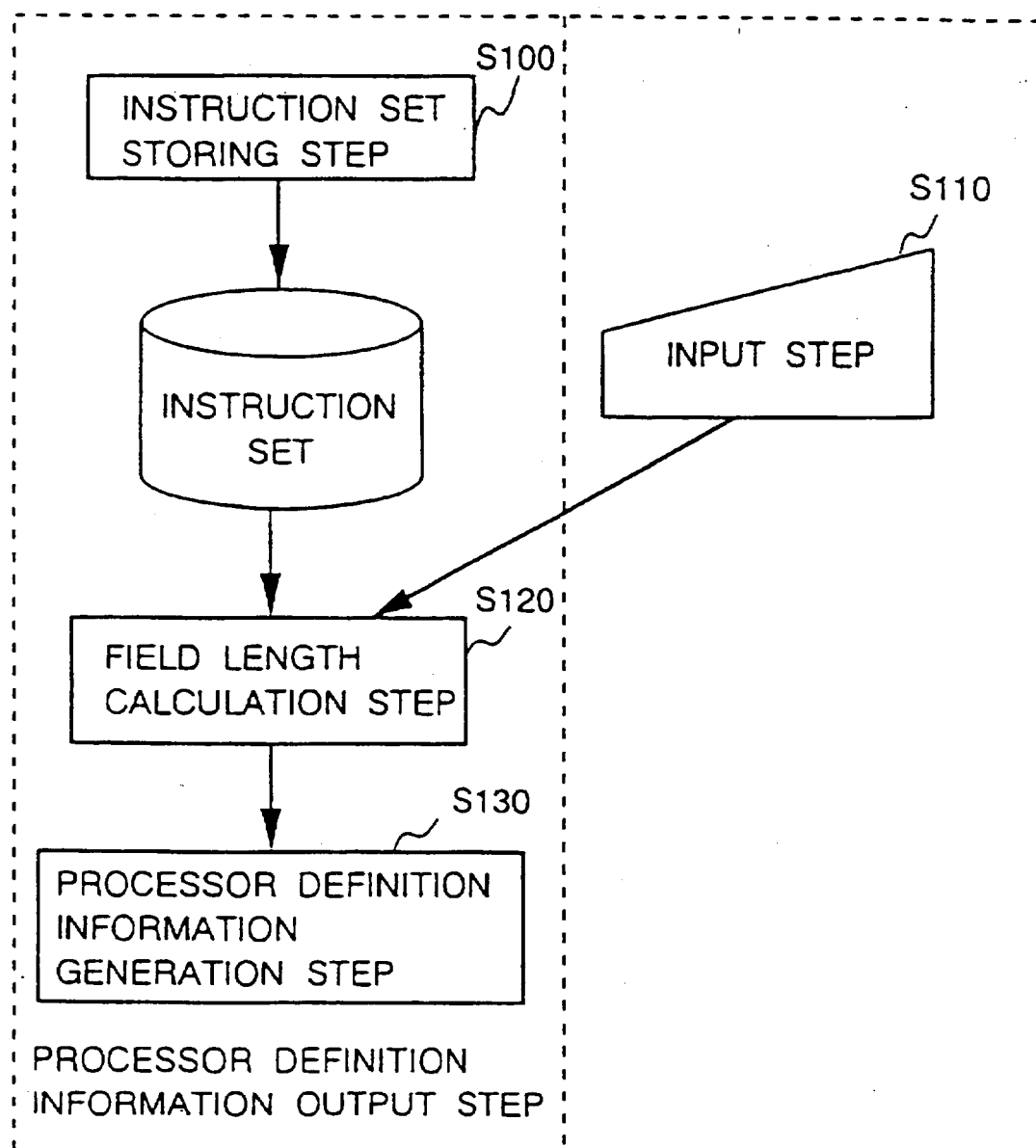
FIG. 12 is a flow chart showing a sequence of operations proceeding from an input step for receiving primary parameters through an output step for outputting processor definition information according to the processor synthesis method of the present invention.

FIG. 12 is a block diagram showing a sequence of operations proceeding from an input step for receiving primary parameters through an output step for outputting the processor definition information according to the processor synthesis method of the present invention.

First, at an instruction set storing step S100, the set of instructions each of which comprising a plurality of the fields are prestored. For details of the instruction set, reference has been made in the first embodiment.

Next, at an input step S110, the primary parameters are input. The primary parameters to be input are the number of registers in the register file, the CPU bit width, and the data memory size and the instruction memory size.

Then, at a field length calculation step S120, according to the primary parameters input at the input step S110 and by referring to the instruction set prestored at the instruction set storing step S100, the individual lengths of the fields constituting an instruction are calculated as the secondary parameters.

Then, at a processor definition information generation step S130, based on the individual lengths of the fields calculated as the secondary parameters at the field length calculation step S120, the processor definition information is generated.

Finally, at the processor definition information output step, the generated processor definition information is output.

Figure 13:
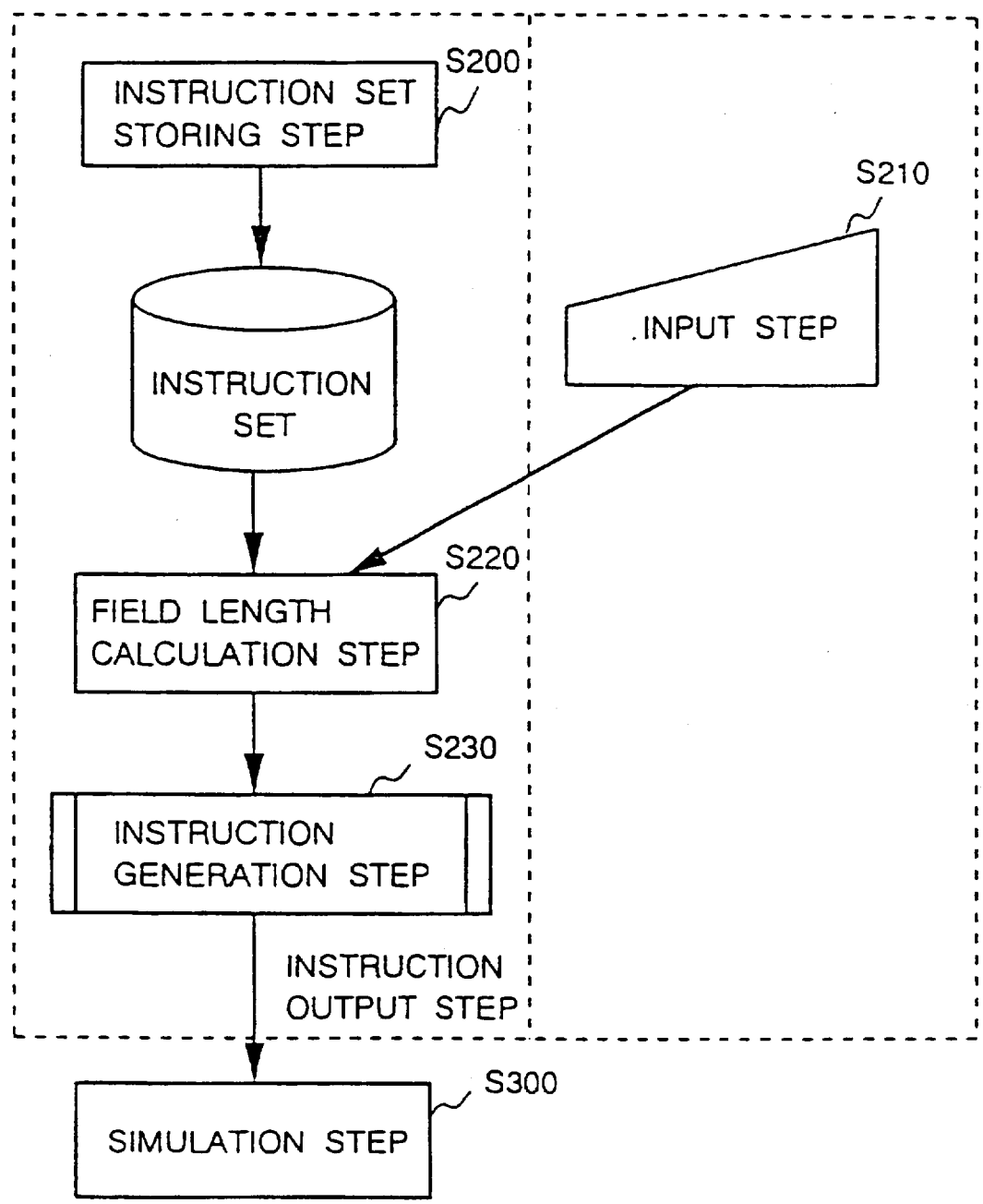
FIG. 13 is a flow chart showing a sequence of operations proceeding through an input step through an instruction output step and a simulation step according to the processor synthesis method of the present invention.

FIG. 13 is a block diagram showing a sequence of operations proceeding from an input step through an instruction output step and a simulation step according to the processor synthesis method of the present invention.

The steps S200 through S220 in FIG. 13 correspond to the steps S100 through S120 in FIG. 12.

First, at an instruction set storing step S200, the set of instructions comprising a plurality of the fields is prestored.

Next, at an input step S210, the primary parameters such as the number of registers in the register file, the CPU bit width, the data memory size, and the instruction memory size are input.

Then, at a field length calculation step S220, according to the primary parameters input at the input step S210 and by referring to the instruction set prestored at the instruction set storage step S200, the lengths of the fields constituting an instruction are calculated as secondary parameters.

Finally, at an instruction generation step S230, based on the individual lengths of the fields calculated as the secondary parameters at the field length calculation step S220, a program expressed in a predetermined programming language is translated into machine instructions.

Referring to the drawing, the instruction generation step will be more fully described.

Figure 14:
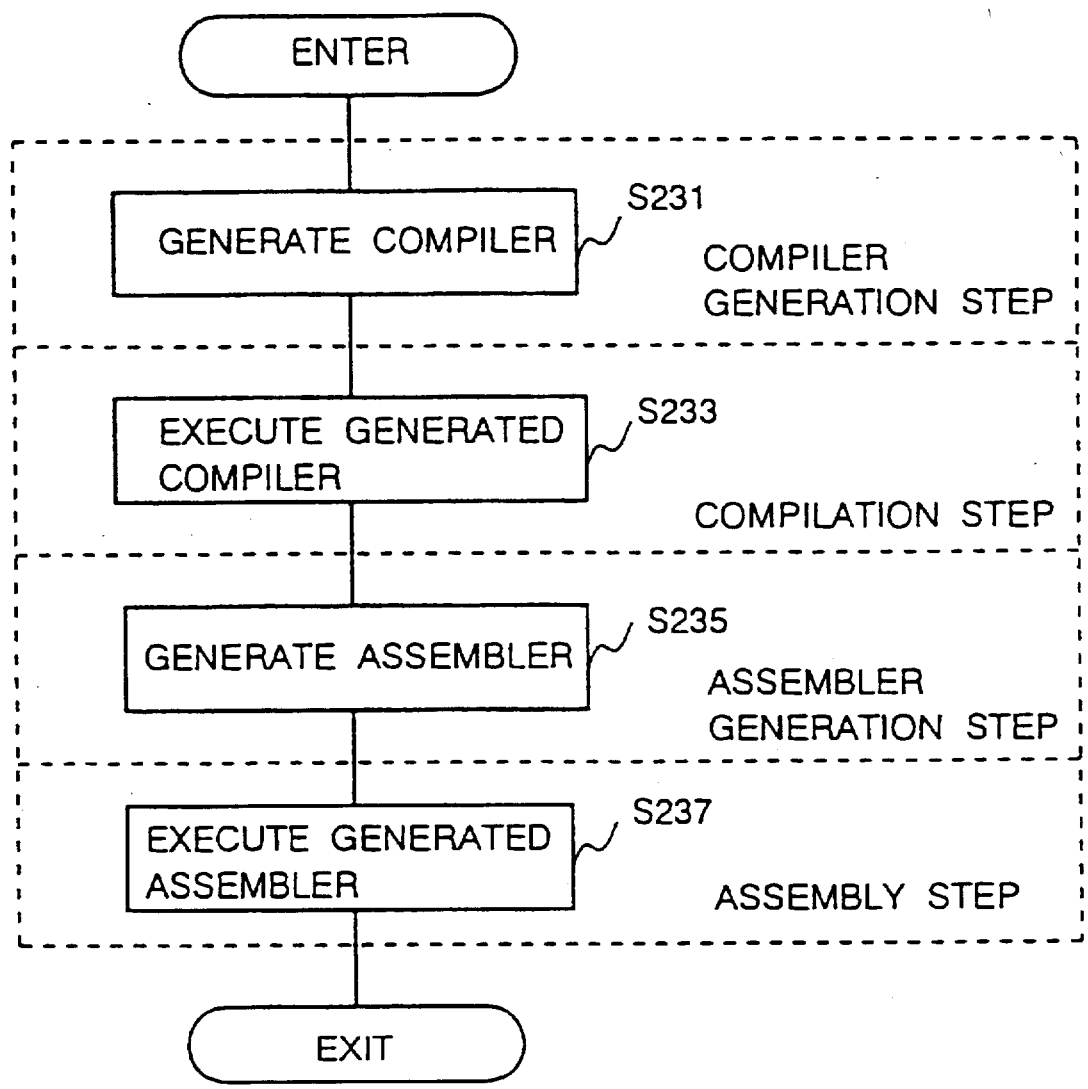
FIG. 14 is a flow chart showing the details of an instruction generation step according to the processor synthesis method of the present invention.

FIG. 14 is a flow chart showing the details of the instruction generation step.

Reference numeral S231 denotes a compiler generation step for generating a compiler. A compiler receives a program expressed in a predetermined programming language, translates (compiles) the program into an assembly code expressed in an assembly language. At the compiler generation step, the whole compiler itself may be generated. Alternatively, when using a retargettable compiler, the user may prepare for the main part of the compiler itself beforehand, generate the processor definition information based on the secondary parameters, and combine the processor definition information with the prepared main part of the compiler so as to accomplish compiler generation.

Reference numeral S233 denotes a compilation step for executing the compiler generated at the above-mentioned compiler generation step. By means of this compiler, the application program expressed in a high-level language is translated (compiled) into an assembly code expressed in an assembly language.

Reference numeral S235 denotes an assembler generation step. An assembler receives the assembly code produced by the compiler, assembles, and output an instruction code for the instruction set in the CPU. The instruction code almost individually corresponds to each instruction of the instruction set in the CPU.

Reference numeral S237 denotes an assembly step for executing the assembler generated at the above-mentioned assembler generation step. The assembly code produced in the compilation step are input, and assembled into the instruction code.

In FIG. 14, instruction generation is accomplished by going though the compiler generation step, the compilation step, the assembler generation step, and the assembly step sequentially. However, the sequence of the instruction generation step may be changed if the following conditions are satisfied:

The compilation step is executed after the compiler generation step.

The assembly step is executed after the assembler generation step.

The assembly step is executed after the compilation step.

Instruction generation may be accomplished, for example, by going through the assembler generation step, the compiler generation step, the compilation step, and the assembly step sequentially.

As an option, at a simulation step S300 illustrated in FIG. 13, the machine instructions which have been generated and output at the instruction generation step may be used to accomplish simulation for the synthesized CPU.

This simulation is executed, based on the processor definition information which has been generated according to the primary parameters entered by the designer. The simulation is also executed by using the instruction code generated based on the processor definition information.

By means of this simulation, the designer can verify the actions of the programs he has prepared and the effects of the primary parameters he has entered before the designed CPU is actually fabricated. The designer can also examine the cost and efficiency of the processor being designed.

Next, an embodiment of the processor synthesis system will be described.

As described hereinbefore, in this embodiment, the "Tsutsuji" logic synthesis system marketed by Zuken Incorporated is used for synthesizing the processor. The C programming language is used for expressing the application program to be executed on the synthesized processor. The hardware configuration is as shown in FIG. 3.

Figure 15:
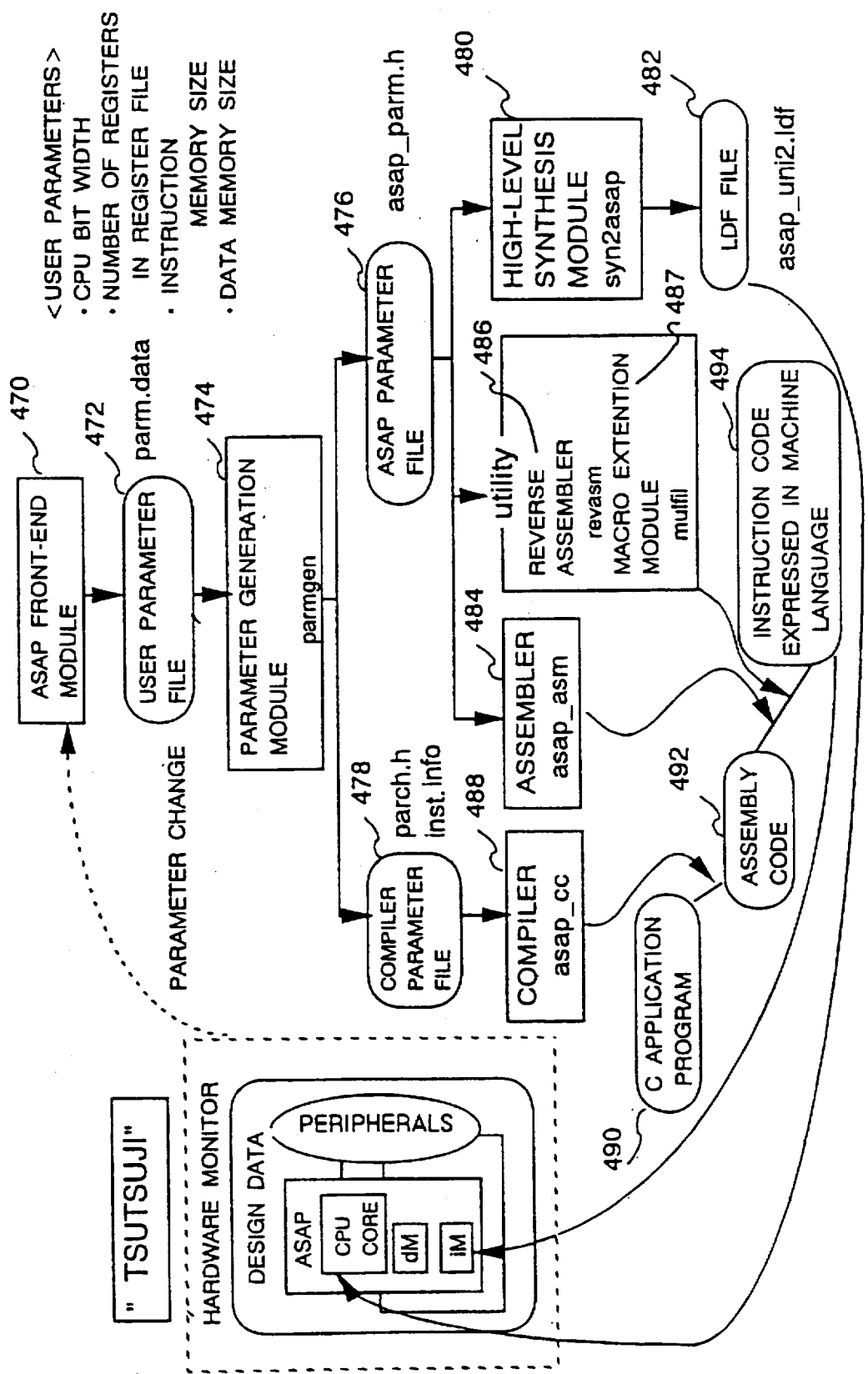
FIG. 15 is a block diagram showing an overall system flow of the processor synthesis system according to the present invention.

FIG. 15 is a block diagram showing an overall system flow of the processor synthesis system according to the present invention.

In FIG. 15, reference numeral 470 denotes an ASAP front-end module whereby the designer actuates this processor synthesis system.

Figure 16:
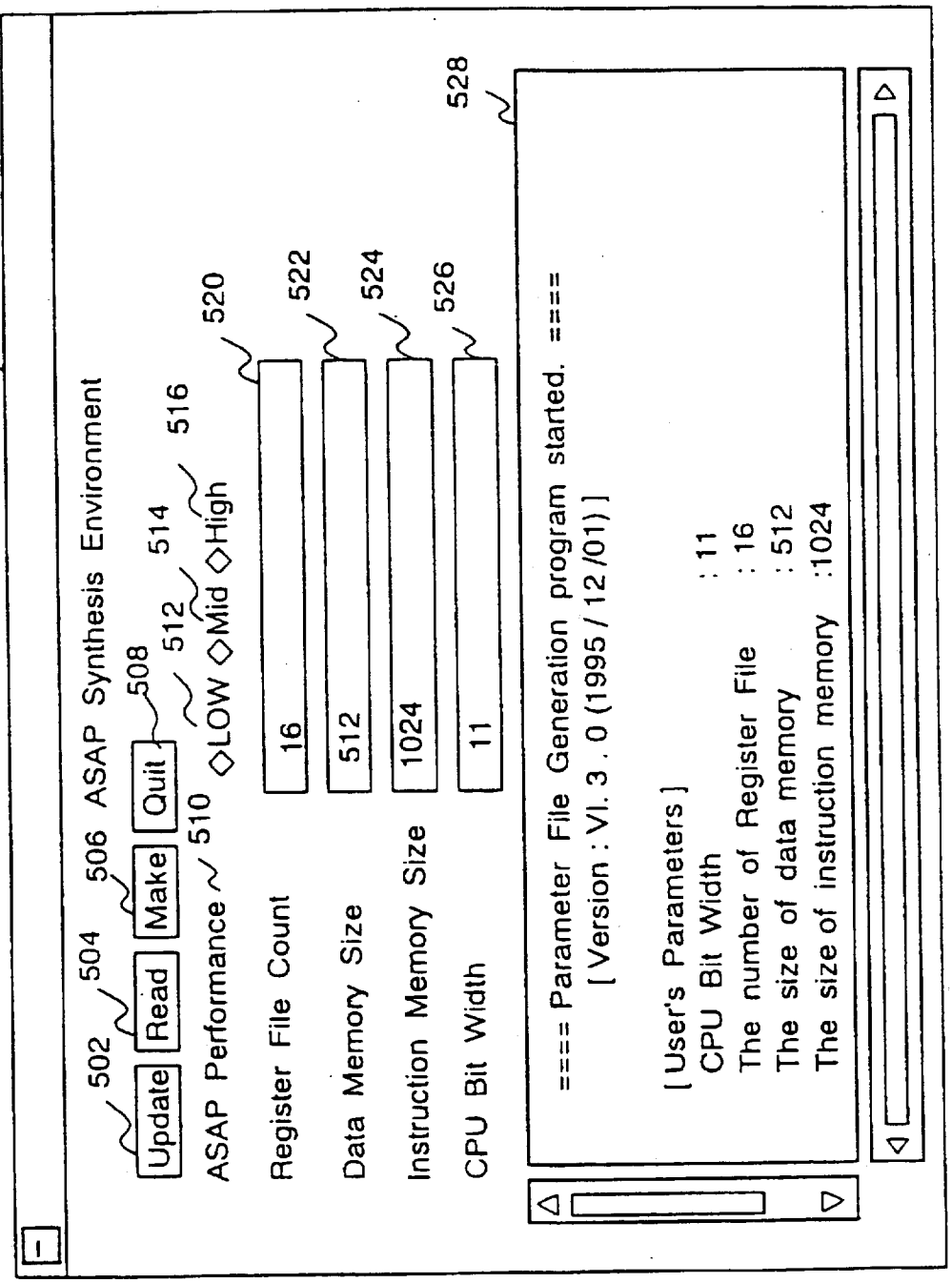
FIG. 16 is a control panel display, which is a GUI of the processor synthesis system according to the present invention.

FIG. 16 is a control panel display showing a GUI (Graphical User Interface) provided by the ASAP front-end module. A front-end window 500 is displayed on the display 6a shown in FIG. 3. The designer sets and enters the primary parameters into a register file count display column 520 for indicating the number of registers in the register file, a data memory size display column 522, an instruction memory size display column 524, and an CPU bit width display column 526, respectively.

In this embodiment, the primary parameters which are to be set by the designer are stored in a user parameter file 472 illustrated in FIG. 15. Referring again to FIG. 16, when the designer depresses an "Update" button 502, the contents of the user parameter file are updated to the values set in the register file count display column 520, the data memory size display column 522, the instruction memory size display column 524, and the CPU bit width display column 526, respectively. When the designer depresses a "Read" button 504, the values of the primary parameters are read from the user parameter file 472 and individually displayed on the display columns 520 through 526. When the designer depresses a "Make" button 506, processor synthesis is executed according to the values of the primary parameters set and displayed on the displays 520 through 526. When the designer depresses a "Quit" button 508, processor synthesis is terminated.

Figure 17:
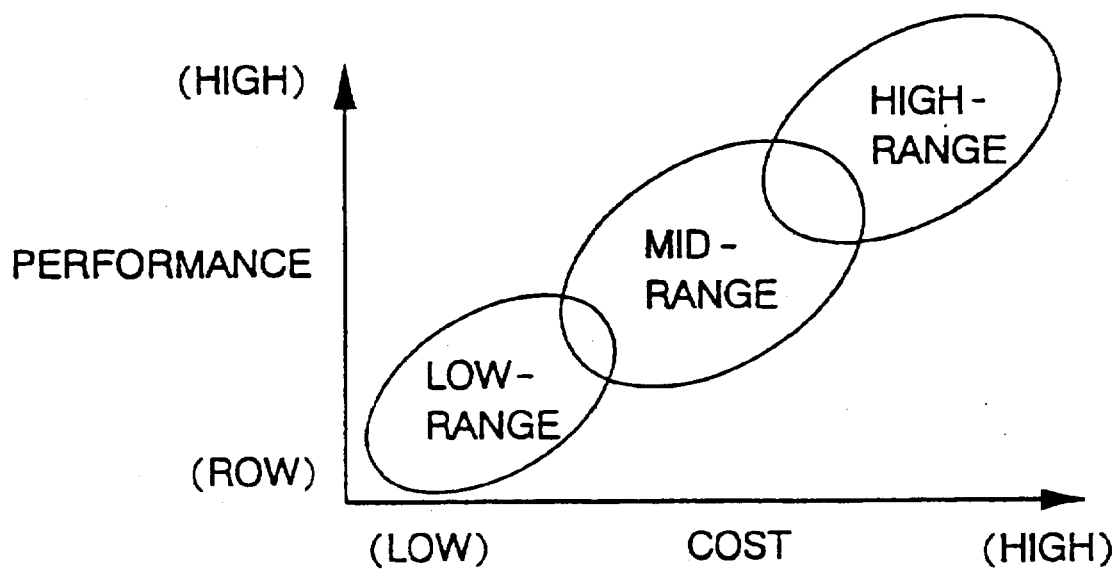
FIG. 17 is a graph showing three processor performance ranges determined by the cost and the performance of the processor synthesized according to the processor synthesis system of the present invention.

An ASAP performance display 510 allows the designer to select any of the three performance modes which include a Low-range performance mode 512, a Mid-range performance mode 514, and a High-range performance mode 516. Low-, mid-, and high-range performance modes respectively correspond to the three ranges determined by the cost and the performance of the processor shown in FIG. 17. Specifically, the CPU bit width in the Low-range performance mode 512 is set to 4–8 bits, while the CPU bit width in the Mid-range performance mode 514 is set to 8–32 bits. In the High-range performance mode, the CPU bit width is set to 20–64 bits. The ASAP architecture which has been described so far in these first and second embodiments is assumed to be based on a template for the Mid-range performance mode. For the Low-range performance mode, a single memory architecture template is used to synthesize the processor, while for the High-range performance mode, a VLIW (Very Long Instruction Word) architecture template is used. The designer selects and specify the ASAP performance among the Low-range performance mode 512, the Mid-range performance mode 514, and the High-range performance mode 516 as one of the synthesis parameters in terms of the application program adapted for use in the synthesized processor or such factors as the cost or the performance of the synthesized processor.

The above-mentioned templates of the three performance ranges are presented on the front-end window because it is considered that the optimal architecture of the processor should be available according to the CPU bit width. Based on each template specifying the optimal architecture according to the CPU bit width, the processor is synthesized.

FIG. 18 is a portion of the program listing the contents of the user parameter file storing the primary parameters.

As shown in FIG. 18, a register file count 552 (rfcnt) indicating the number of registers in the register file is set to 16, a data memory size (dm_size) 554 is set to 512 words, an instruction memory size (im_size) 556 is set to 1024 words, and a CPU bit width (cpuw) 558 is set to 11 bits. These values set and displayed in each of the display columns are stored.

In FIG. 18, lines beginning with ";" are comment lines.

Referring again to FIG. 15, after the primary parameters have been input into the user parameter file 472, a parameter generation module 474 is executed. The parameter generation module 474 receives the user parameter file 472 shown in FIG. 18, calculates the secondary parameters, and generates an ASAP parameter file 476 and compiler parameter files 478.

FIGS. 19 and 20 are log lists 560 and 580, respectively showing the execution records of the parameter generation module (parmgen) 474.

In FIG. 19, reference numeral 562 indicates that secondary parameter generation has started. Reference numerals 564 through 570 denote the primary parameters entered. Reference numeral 564 indicates that the CPU bit width is 11 bits, 566 indicates that the number of registers in the register file is 16, 568 indicates that the data memory size is 512 words, and reference numeral 570 indicates that the instruction memory size is 1024 words.

In FIG. 20, reference numeral 582 shows the process whereby the relation with each of the primary parameters in individual fields is checked to determine the length of the seven classes of the instructions, and the instruction length is finally determined. For details of the process, reference has already been made in the first embodiment. Reference numeral 584 indicates that an ASAP parameter file (asap_parm.h) has been generated, while reference numeral 586 indicates that compiler parameter files (parch.h, inst.info) have been generated. Reference numeral 588 indicates that secondary parameter generation has been completely finished.

FIG. 21 shows generated ASAP parameter file (asap_parm.h) contents 590.

In FIG. 21, reference numeral 592 shows the primary parameters. Reference numeral 594 shows the secondary parameters generated through the primary parameters.

Reference 596 shows the values of the secondary parameters generated. Reference numeral 596a indicates that the register file address bit width is defined as 4 bits, 596b indicates that the instruction memory address bit width is defined as 10 bits, 596c indicates that the data memory address bit width is defined as 9 bits, 596d indicates that the CPU bit width is defined as 11 bits, and 596e indicates that the Op code bit width is defined as 5 bits. Reference numeral 596f indicates that the microcontrol field bit width is defined as 4 bits, and 596g indicates that the Short Immediate operand field bit width is defined as 4 bits, 596h indicates that the condition code bit width is defined as 4 bits, and reference numeral 596i indicates that the branch displacement field bit width is defined as 8 bits. The branch field displacement field bit width is calculated from the before-mentioned other bit widths and the instruction register bit width. Reference numeral 596j indicates that the instruction register bit width is defined as 21 bits.

FIG. 22 shows generated compiler parameter file (parch.h) contents 600.

As described above, in the parameter generation module 474, the primary parameters which have been entered by the designer are converted into the secondary parameters and supplied to the processor synthesizer and the instruction generator.

Referring again to FIG. 15, the ASAP parameter file 476 is input into a high-level synthesis module (syn2asap) 480, an assembler (asap_asm) 484, a reverse assembler(revasm) 486, and a macro extension module (mulfil) 487.

The high-level synthesis module (syn2asap) 480 receives the ASAP parameter file (asap_parm.h) 476 and produces an LDF file (asap_uni2.1df)482.

FIG. 23 is a log list 602 showing the execution record of the high-level synthesis module (syn2asap) 480.

FIG. 24 shows produced LDF file (asap_uni2.1df) contents 610.

In FIG. 24, reference numeral 612 denotes a bibliographical data description column written in the LDF. Reference numeral 614 denotes a comment indicating that the constants are to be listed below. Reference 616 indicates that the instruction register bit width is defined as 21 bits, 618 indicates that the Op code bit width is defined as 5 bits, 620 indicates that the condition code bit width is defined as 4 bits, 622 indicates that the microcontrol field bit width is defined as 4 bits, 624 indicates that the Short Immediate operand field bit width is defined as 4 bits, and reference numeral 626 indicates that the branch displacement field bit width is defined as 8 bits. As described hereinbefore, the branch displacement field bit width is calculated from the other bit widths.

Reference numeral 630 denotes a comment indicating that the primary parameters (displayed as Synthesis Parameters in FIG. 24) are to be listed below. Reference numeral 632 indicates that the register file address bit width is defined as 4 bits, 634 indicates that the CPU bit width is defined as 11 bits, 636 indicates that the instruction memory address is defined as 10 bits, and reference numeral 638 indicates that the data memory address is defined as 9 bits. Reference numeral 640 denotes a description column for fixed definition data.

The produced LDF file is input into the "Tsutsuji" logic synthesis system. The high-level synthesis module (syn2asap) corresponds to the processor synthesizer which has been described in the first embodiment.

Referring again to FIG. 15, in the process for generating the assembler (asap_asm) 484, the ASAP parameter file (asap_parm.h) 476 is input. Then, the assembler (asap_asm) 484 is generated according to the ASAP parameter file 476 input. The generated assembler (asap_asm) 484 receives an assembly code 492 compiled by the compiler and expressed in the assembly language, and assembles it into an instruction code 494 expressed in the machine language.

In the process for generating the reverse assembler (revasm) 486 and the macro extension module (mulfil) 487, the ASAP parameter file (asap_parm.h) is input to generate these utility programs. The process for generating the assembler (asap_asm) and the process for generating the reverse assembler (revasm) and the macro extension module (mulfil) correspond to the process for generating the assembler generator, which is a portion of the instruction generator that has been described in the first embodiment.

FIG. 25 is a log list 650 recording the process for generating the assembler (asap_asm) 484 and the reverse assembler (revasm) 486.

In the process for generating a compiler (asap_cc) 488 illustrated in FIG. 15, the compiler parameter files (parch.h, inst.info) 478 are input. Then, the compiler is generated according to the secondary parameters specified in the compiler parameter file. The process for generating the compiler (asap_cc) corresponds to the process for generating the compiler generator which is a portion of the instruction generator that has been described in the first embodiment.

Figure 26:
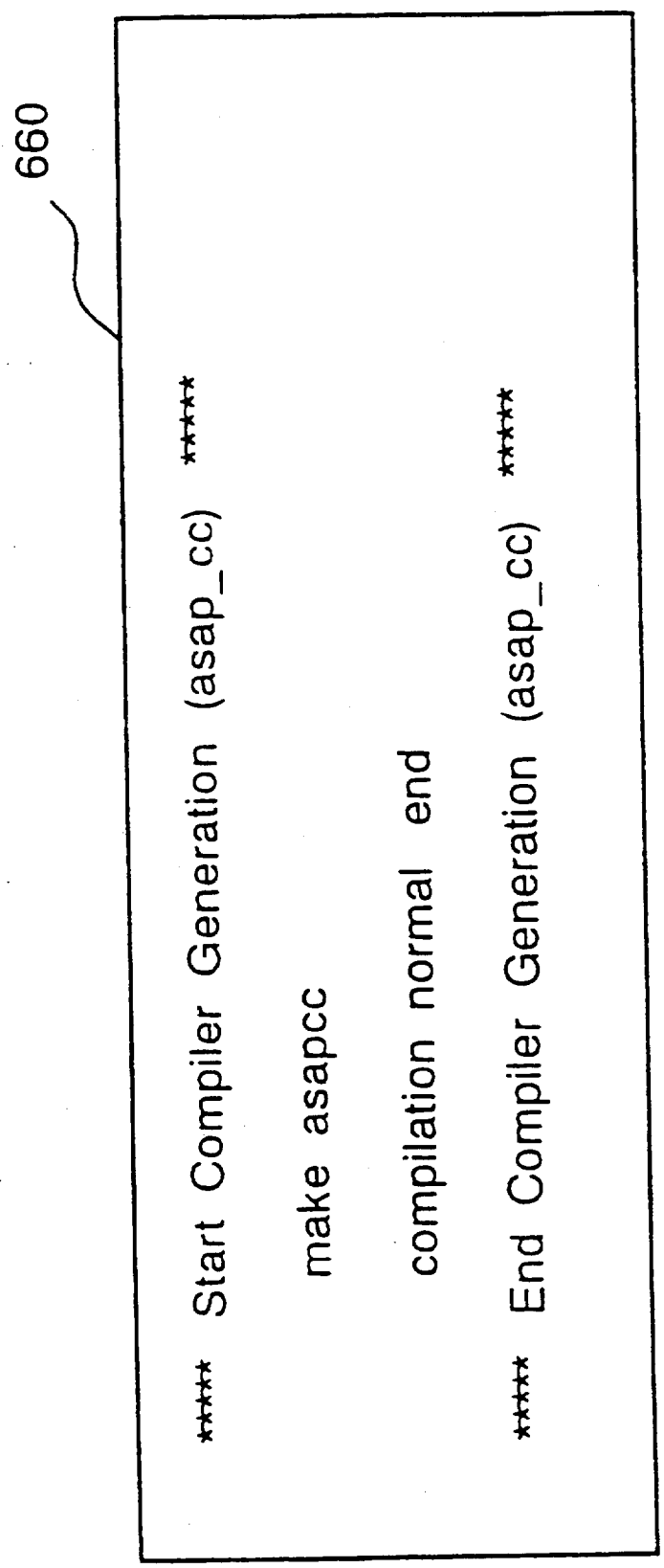
FIG. 26 is a log list showing the execution record of compiler generation according to the processor synthesis system of the present invention.

FIG. 26 is a log list 660 recording the process for generating the compiler (asap_cc).

Referring again to FIG. 15, since the generated compiler (asap_cc) is based on the same secondary parameters as those for synthesizing the processor, it is matched with the architecture of the processor to be synthesized. When the designer enters a C application program 490 into the compiler (asap_cc), the compiler translates (compiles) the program into the assembly code 492 expressed in the assembly language.

The generated assembly code 492 expressed in the assembly language is supplied to the assembler (asap_asm) 484 generated by the assembler generator and assembled. Consequently, the instruction code 494 expressed in the machine language is generated. As described hereinbefore, the compiler and the assembler are generated based on the same secondary parameters as those for generating the hardware definition information. Thus, the generated instruction code can be used in the synthesized processor.

FIG. 27 is a log list 670 listing the execution records of the compiler (asap_cc).

In FIG. 27, reference numeral 672 denotes a command for receiving an application program "samp.c" expressed in the C language and for executing compilation.

FIG. 28 shows an application program "samp.c" example 680.

In FIG. 27, reference numeral 676 indicates that the compiler (asap_cc) generates the assembly code and outputs it as a file (samp.s). FIG. 29 shows output file (samp.s) contents 682.

FIG. 30 is a log list 690 showing the execution record of the assembler (asap_asm) after the file (samp.s) has been input into the assembler (asap_asm).

FIG. 31 shows a list 694 showing an instruction code which has been assembled and output, and which is expressed in the machine language.

As described hereinbefore, these machine instructions almost individually correspond to each instruction of the instruction set in the CPU. The output machine instructions are stored in the instruction register of the synthesized processor, and executed.

Next, the execution of the system simulation will be described.

In the processor synthesis system according to the present invention, by using the generated machine instructions, simulation of the synthesized processor is possible.

Figure 32:
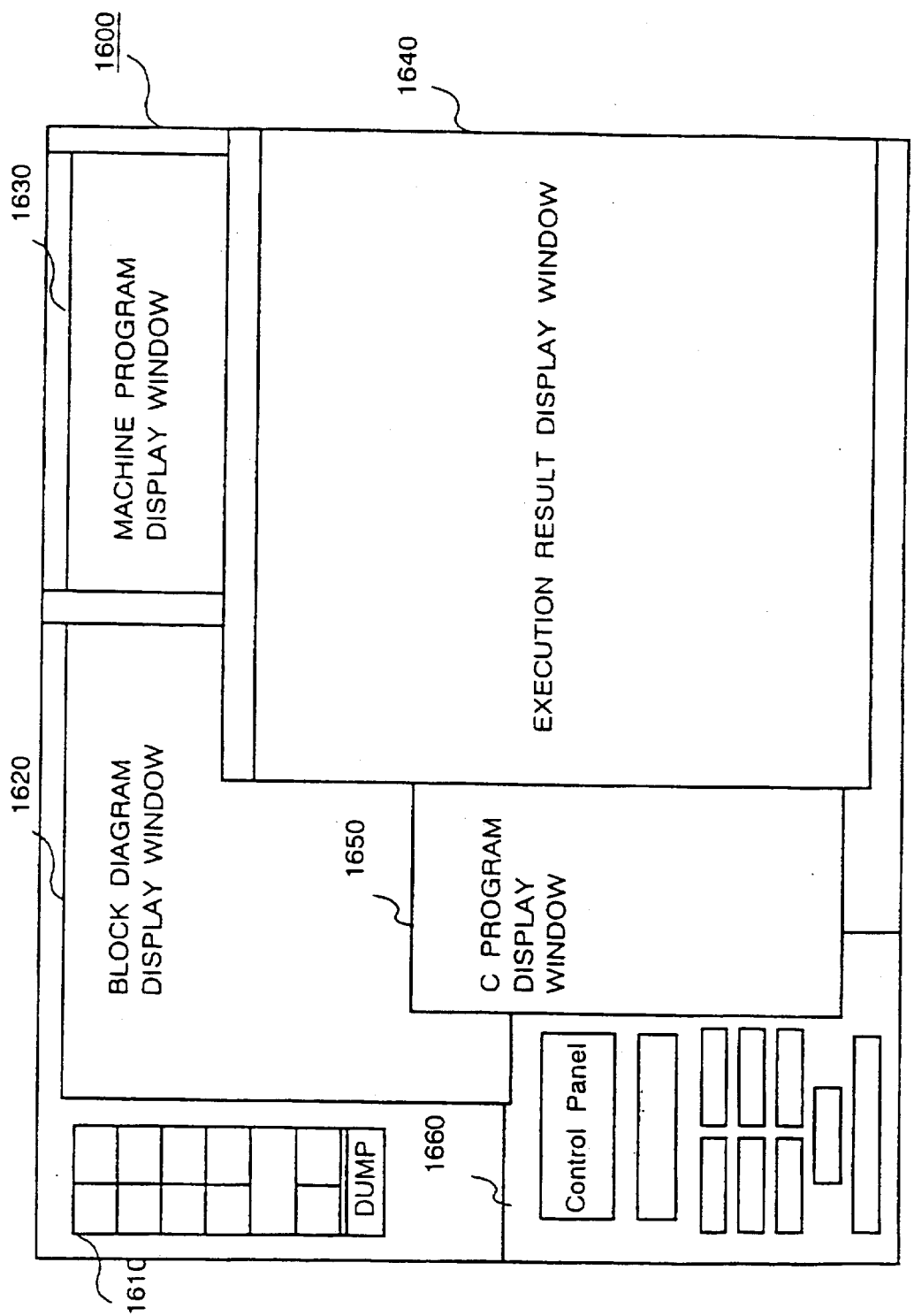
FIG. 32 is an illustration of a simulator screen showing execution records of simulation implemented by the processor synthesis system of the present invention.
Figure 35:
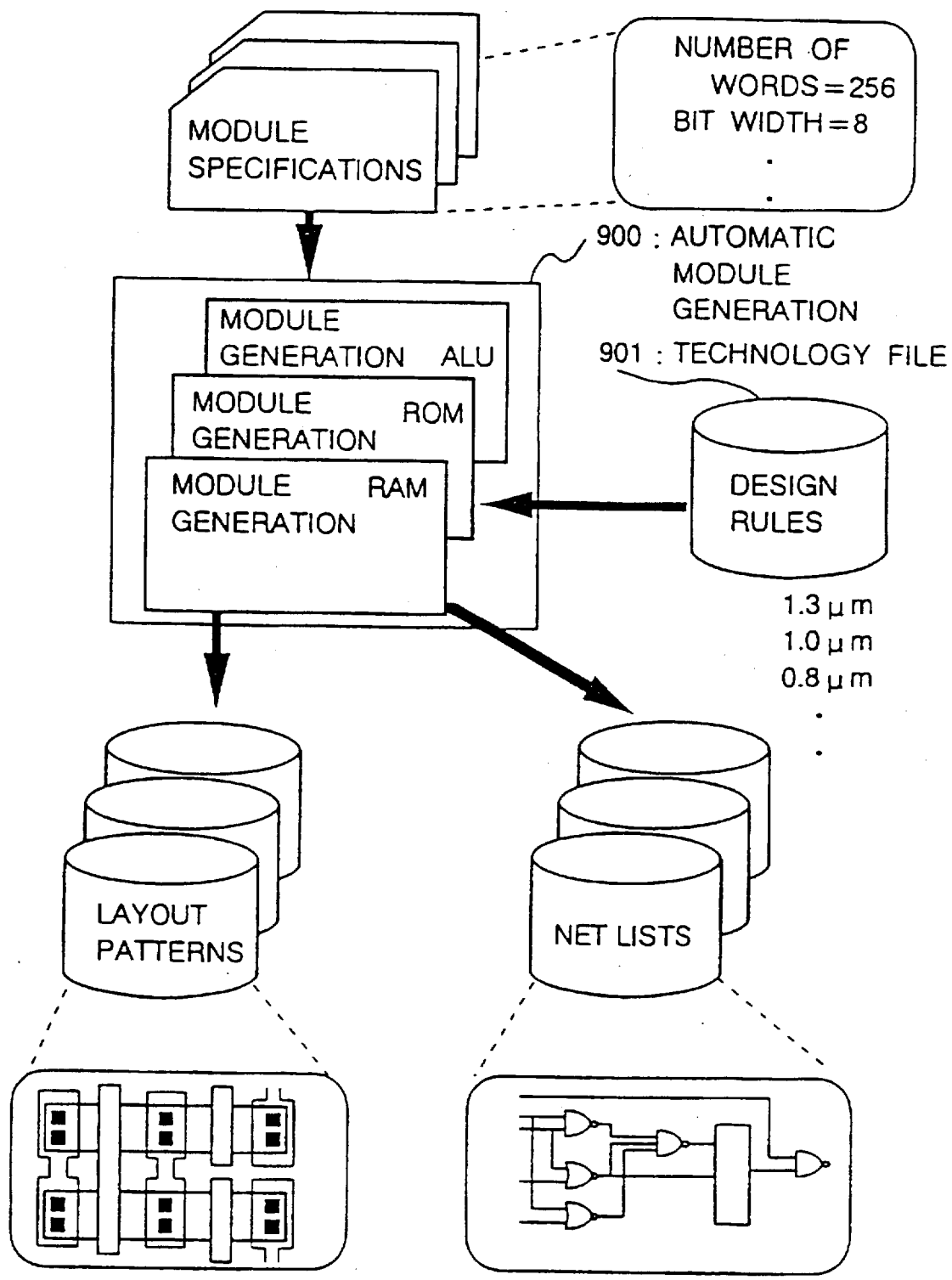
FIG. 35 is a block diagram showing the function of a conventional module compiler implementing automatic module generation.
Figure 36:
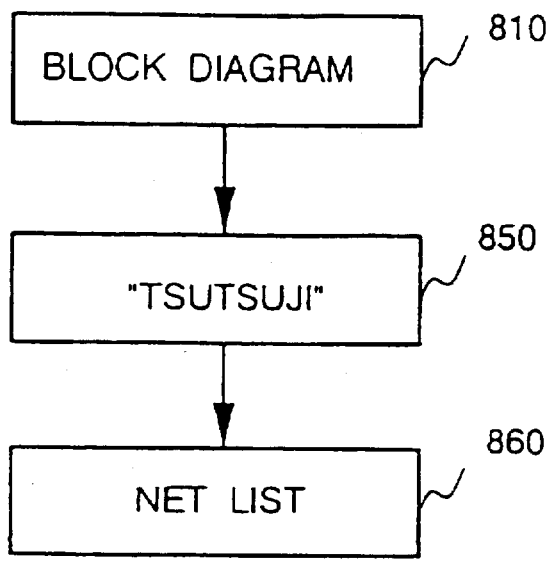
FIG. 36 is a flow chart showing how the conventional "Tsutsuji" logic synthesis system is used for generating a netlist.
Figure 37:
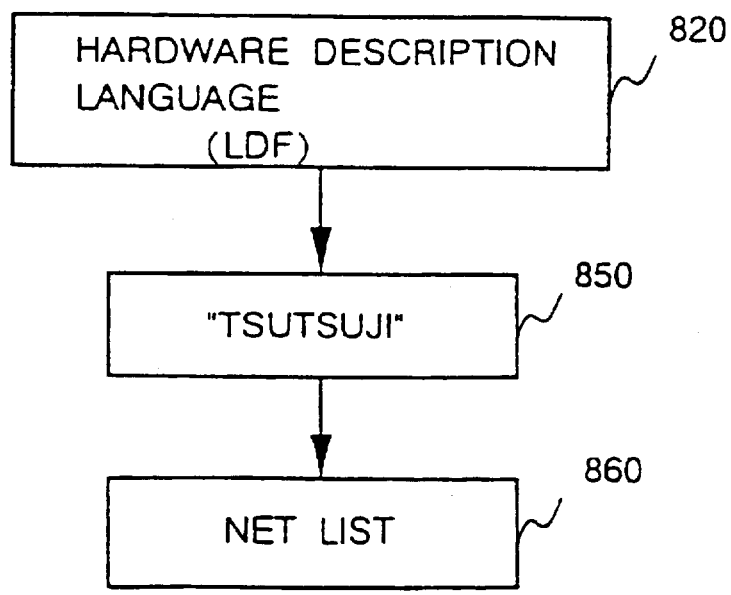
FIG. 37 is a flow chart showing how the conventional "Tsutsuji" logic synthesis system is used for generating a netlist.
Figure 38:
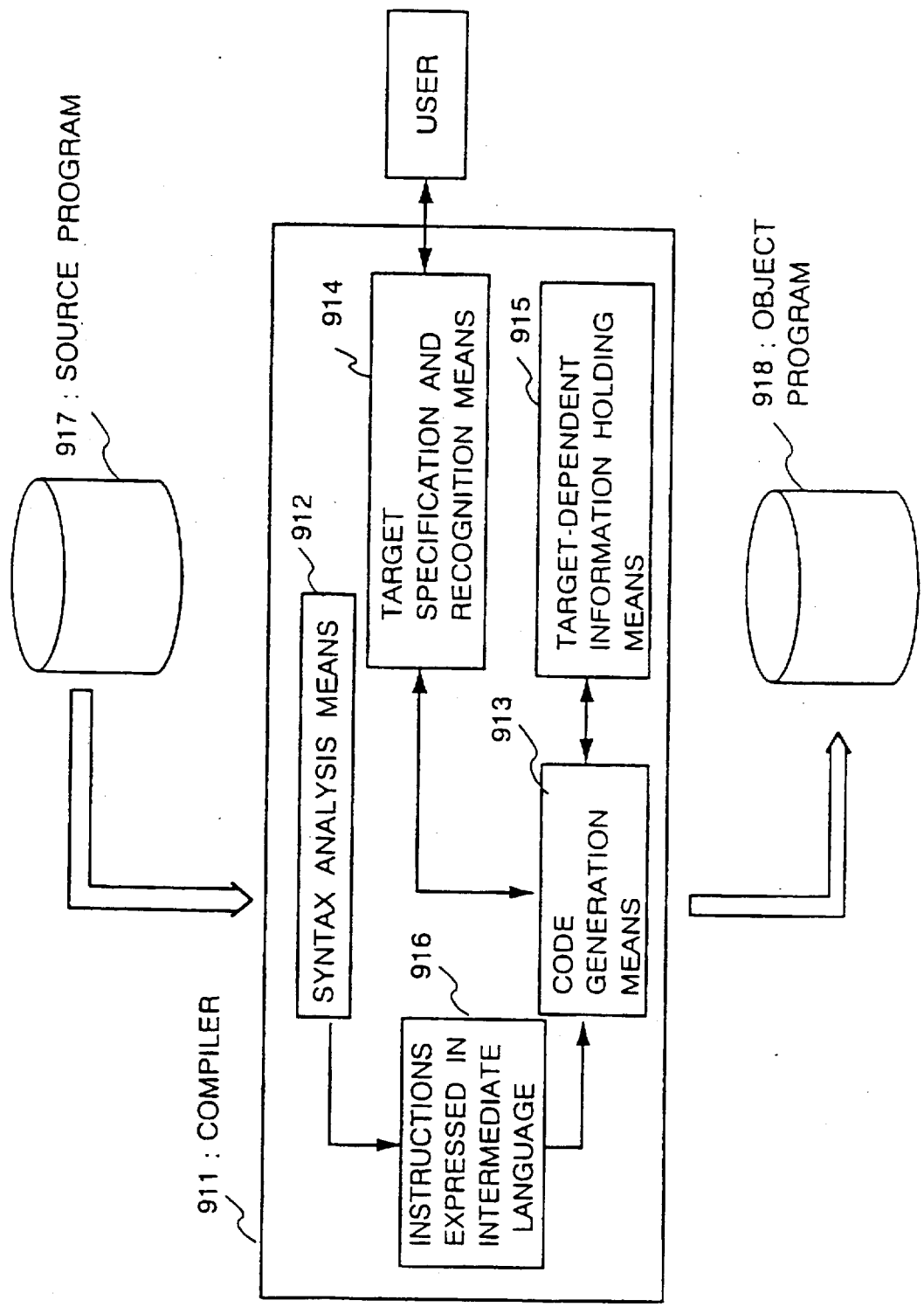
FIG. 38 is a block diagram showing the overall configuration of the conventional "Retargettable Compiler System"
Figure 39:
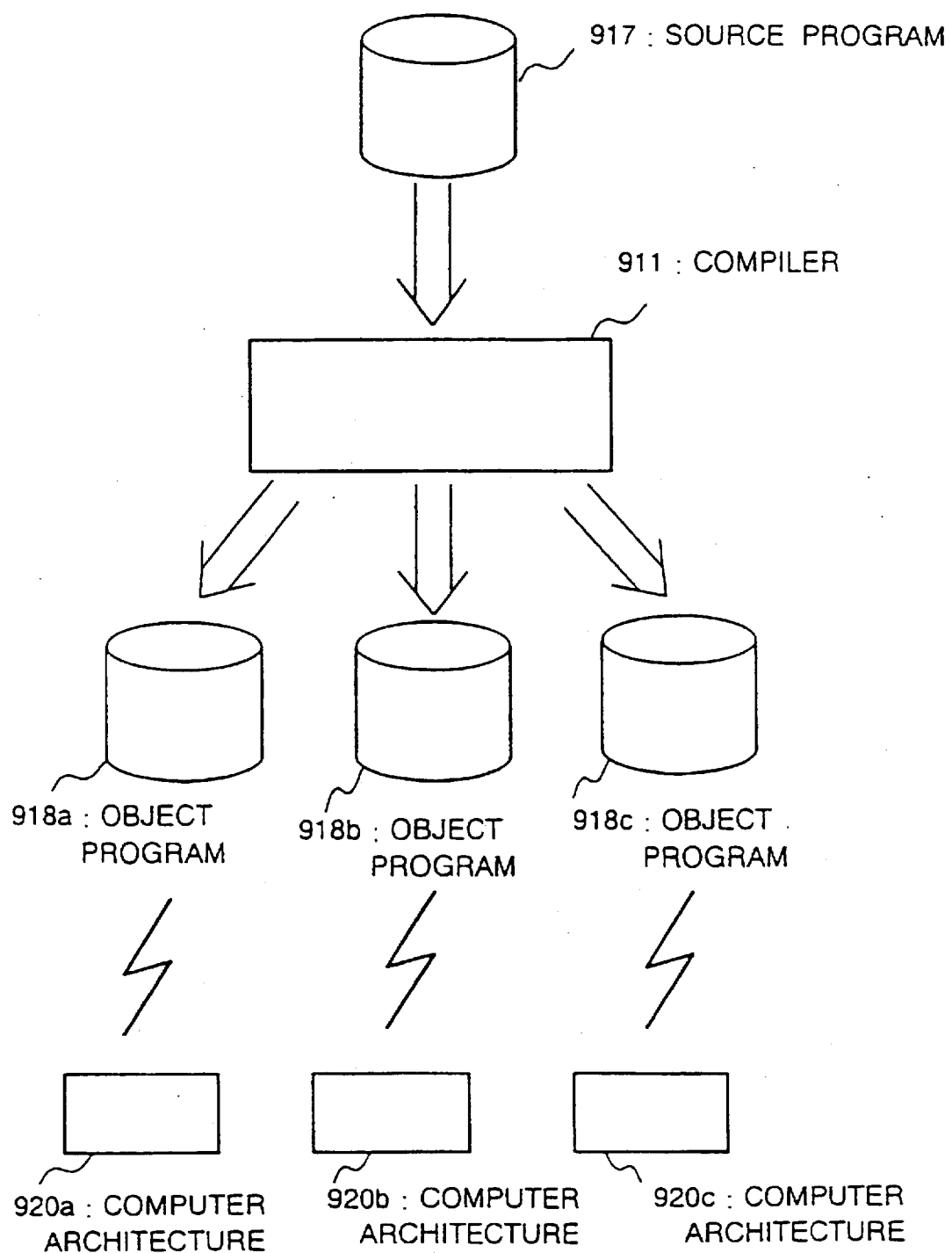
FIG. 39 is a block diagram showing an example of how the conventional "Retargettable Compiler System" is used for obtaining object programs.

FIG. 32 shows an illustration of a simulator screen.

A simulator screen 1600 is a display screen where a result of simulation is presented when the simulation is executed. The screen is provided with manipulation buttons 1610. On the screen, a block diagram display window 1620 for displaying a block diagram of the processor and the peripherals, a machine program display window 1630 for displaying a machine program being executed, an execution result display window 1640, a C program display window 1650, a control panel window 1660 are presented simultaneously. This allows the designer to select and view the desired window and implement debugging on the prepared application program as simulation proceeds. The designer, if necessary, can alter the program, execute instruction generation again, and resume simulation using the machine instructions which have been generated again. Alternatively, depending on the result of the simulation, the primary parameters can be changed and processor synthesis can be accomplished again. By repeating the above-mentioned operations as needed over and over again, the designer can try to optimize the CPU and the application program to be operated on the CPU before the CPU is actually fabricated, and can seek to obtain the optimum cost/performance characteristics.

FIG. 33 is a table comparing the functions of an ASAP according to the present invention and a conventional mega cell.

While the object of the mega cell implementation of CPUs is to place a CPU on an ASIC, the ASAP implementation aims at system generation. The ASAP itself is optimized as a part of the generated system. In the conventional mega cell implementation, maximum performance for a fixed cost is targeted. On the other hand, in the ASAP implementation, the performance of the processor to be synthesized is set within the context of the system requirements, and the reduction of the cost is maximized. In the conventional mega cell implementation, the CPU bit width, the instruction word length, and the address space are predefined. In the ASAP implementation, these parameters can be reduced to the values of the required minimum levels. Accordingly, with this minimization, the ASAP architecture becomes variable, resulting in a parameterized architecture. The term "parameterized architecture" used herein is employed to mean the architecture which is subject to change depending on the primary or secondary parameters. While the mega cell implementation of CPUs requires a license from the mega cell manufacturer, the ASAP implementation does not require the license because it is synthesized by the user. With regard to the compiler, the mega cell implementation defines the compiler for the existing processor with a fixed architecture. The ASAP implementation, on the other hand, defines the processor for the compiler being generated, based on the primary or secondary parameters. In other words, the processor definition information is supplied to the compiler, thus enabling the compiler to be matched with the parameterized architecture.

FIG. 34 is a diagram for comparing the size of a chip using the existing processor on an LSI designed for communications control with the size of a chip using the ASAP in place of the existing processor.

As shown in FIG. 34, the chip size is reduced by 27%, and the processor core size is reduced by 56%.

As described hereinbefore, in this embodiment, the actual operations required for synthesizing the processor has been described. The designer can generate the processor definition information for synthesizing the processor, and the instruction code for the synthesized processor by simply actuating the processor synthesis system and entering primary parameters. In the instruction code generation process, the designer can generate the compiler for the processor definition information.

Generation of the compiler thus allows the designer to describe the application program using a high-level programming language such as the C programming language. Consequently, compared to the case where the program is prepared using the assembly language or the machine language, the load for developing the application programs can be reduced, and the development period can also be reduced.

Furthermore, using the generated instruction code, simulation of the processor is possible. System optimization can also be achieved by implementing the simulation. In the system optimization, when changing the system specifications, the designer should only change the primary parameters. Then, the processor synthesis system generates the processor definition information and generates the compiler for the generated processor definition information. Consequently, the application program does not need to be modified. The application program should only be recompiled. Furthermore, even when modification of the application program is required because of the simulation result, modification can be accomplished easily since the application program is expressed in the high-level programming language.

Embodiment 3

In the embodiments described hereinbefore, the hardware description language describing the hardware description information is assumed to be the LDF (Logic Description Format). However, other hardware description languages such as the VHDL (Very High Speed IC Hardware Description Language) or the Verilog-HDL (Verilog-Hardware Description Language) may also be used.

By expressing the hardware definition information in a standard hardware description language and using the other logic synthesis system besides the "Tsutsuji" logic synthesis system, the CPU can also be synthesized and fabricated.

According to the present invention, by simply entering the primary parameters, the processor designer can obtain the processor definition information which can be input into the logic synthesis system. Thus, the processor designer does not need to prepare block diagrams and express the program in the hardware description.

Furthermore, according to the present information, the instructions are generated and output, and are executed by the processor to be synthesized by the processor definition information. Consequently, after the processor has been synthesized, the additional instructions which target the synthesized processor do not need to be generated.

Still furthermore, by generating the compiler and the assembler, the application program can be expressed in a high-level programming language. Consequently, development of the application program can be accomplished efficiently, and the burden of the system designer can be reduced.

Still furthermore, according to the present invention, before actually synthesizing the processor according to the processor definition information, simulation of the processor is possible. Thus, optimization of the processor to be synthesized is possible.

Having thus described several particular embodiments of the invention, various alterations, modifications, and improvements will readily occur to those skilled in the art. Such alterations, modifications, and improvements are intended to be part of this disclosure, and are are intended to be within the spirit and scope of the invention. Accordingly, the foregoing description is by way of example only, and not intended to be limiting. The invention is limited only as defined in the following claims and equivalents thereto.

What is claimed is:

1. A processor synthesis system for synthesizing a processor, comprising:
   a parameter generator for receiving primary parameters, calculating secondary parameters based on the primary parameters, and outputting the secondary parameters;
   a processor synthesizer for generating and outputting processor definition information to synthesize said processor, according to the secondary parameters generated and output by the parameter generator; and
   an instruction generator for generating instructions, according to the secondary parameters generated and output by the parameter generator, for operating the processor to be synthesized by the processor definition information output by the processor synthesizer.

2. A processor synthesis system according to claim 1, wherein the primary parameters comprise a number of registers in a register file, a CPU bit width, a data memory size, and an instruction memory size.

3. A processor synthesis system according to claim 1, wherein the processor definition information is expressed in a hardware description language.

4. A processor synthesis system according to claim 3, wherein the hardware definition language is written in an LDF (Logic Description Format) used in a "Tsutsuji" logic synthesis system.

5. A processor synthesis system according to claim 3, wherein the hardware description language is a VHDL (Very High Speed IC Hardware Description Language).

6. A processor synthesis system according to claim 3, wherein the hardware description language is a Verilog-HDL (Verilog-Hardware Description Language).

7. A processor synthesis system according to claim 1, wherein the instruction generator comprises a compiler generator for generating a compiler for a predetermined programming language, wherein the compiler generates a code for the processor to be synthesized by the processor definition information generated and output by the processor synthesizer.

8. A processor synthesis system according to claim 7, wherein the instruction generator further comprises an assembler generator for generating an assembler receiving and assembling the code generated by the compiler generated by the compiler generator into an instruction code.

9. A processor synthesis system according to claim 1, further comprising a simulator for executing simulation of the processor to be synthesized by the processor definition information output by the processor synthesizer by using the instructions generated by the instruction generator.

10. A processor synthesis system comprising:
    a parameter generator for receiving primary parameters, calculating secondary parameters based on the primary parameters, and outputting the secondary parameters;
    a processor synthesizer for generating and outputting processor information to synthesize a processor, according to the secondary parameters generated and output by the parameter generator; and
    an instruction generator for generating instructions, according to the secondary parameters generated and output by the parameter generator, for operating the processor to be synthesized by the processor definition information output by the processor synthesizer, wherein the processor is provided with a predetermined instruction set including a plurality of instruction, each of the instructions being constituted by a plurality of fields,
    wherein the parameter generator determines individual lengths of the plurality of fields constituting an instruction as the secondary parameters based on the primary parameters, and wherein the processor sythesizer and the instruction generator generate the processor definition information and the instructions matched with the individual lengths of the plurality of fields determined as the secondary parameters and constituting an instruction, keeping the plurality of the instructions in the predetermined instruction set.

11. A processor synthesis system according to claim 10, wherein the processor has a register file including a plurality of registers, wherein the plurality of fields has a register address field representing individual addresses for the plurality of registers, and wherein a bit width of the register address field is determined by a number of the registers in the register file.

12. A processor synthesis system according to claim 10, wherein the plurality of fields has a data address field representing a data memory address, and wherein a bit width of the data address field is determined by the data memory size.

13. A processor synthesis system according to claim 10, wherein the plurality of fields includes a jump address field specifying a jumped-to location, and wherein a bit width of the jump address field is determined by the instruction memory size.

14. A processor synthesis system according to claim 10, wherein the plurality of fields comprises an operation code field for specifying one of the plurality of instructions, a microcontrol field for controlling an arithmetic operation, a register address field for specifying a register address, a data address field for specifying a data memory address, and a jump address field for specifying a jumped-to location, and wherein a total number of bits in the instruction is determined by adding a bit width of the operation code field to a maximum among a sum of a bit width of the microcontrol field and three times a bit width of the register address field, a sum of the bit width of the register address field and a bit width of the instruction address field, a sum of the bit width of the register address field and a bit width of the jump address field, and a sum of the bit width of the register address field and a CPU bit width.

15. A processor synthesis method, comprising steps of:

receiving primary parameters;

generating processor definition information according to the primary parameters received so as to synthesize a processor, and outputting the processor definition information; and generating and outputting instructions according to the primary parameters received by the step of receiving primary parameters, for operating the processor synthesized by the processor definition information output by the step of generating and outputting processor definition information.

16. A processor synthesis method according to claim 15, wherein the step of generating and outputting processor definition information comprises steps of:

prestoring a set of instructions comprised of a plurality of fields;

calculating individual lengths of the plurality of fields constituting an instruction according to the secondary parameters based on primary parameters; and generating the processor definition information, based on the set of instructions and the individual lengths of the plurality of fields.

17. A processor synthesis method according to claim 15, wherein the step of generating and outputting instructions further comprises steps of:

prestoring a set of instructions comprised of a plurality of fields;

calculating individual lengths of the plurality of fields constituting an instruction according to the primary parameters; and translating a program expressed in a predetermined programming language into the instructions, based on the set of instructions and the individual lengths of the plurality of fields.

18. A processor synthesis method according to claim 17, wherein the step of translating a program expressed in a predetermined programming language into the instructions comprises steps of:

generating a compiler for receiving and compiling the program expressed in the predetermined programming language into a code; and inputting the program expressed in the predetermined programming language into the compiler generated by the step of generating a compiler, and compiling the program into the code by the compiler.

19. A processor synthesis method according to claim 18, wherein the step of translating a program expressed in a predetermined programming language into the instructions further comprises steps of:

generating an assembler for receiving the code output by the step of inputting and compiling the program, and for assembling the code into an instruction code; and inputting the code output by the step of inputting and compiling the program into the assembler generated by the step of generating an assembler, and assembling the code into an instruction code by the assembler.

20. A processor synthesis method according to claim 15, further comprising a step of simulating operations of the processor synthesized by the processor definition information output by the step of generating and outputting processor definition information, based on the instructions generated by the step of generating and outputting instructions.

21. A processor synthesis method according to claim 15, wherein the step of receiving primary parameters receives the primary parameters comprising a number of registers in a register file, a CPU bit width, a data memory size, and an instruction memory size.

22. A processor synthesis method according to claim 15, wherein the step of generating and outputting processor definition information uses the processor definition information expressed in a hardware description language.

23. A processor synthesis system, comprising:

(a) a parameter generator for receiving primary parameters, calculating secondary parameters based on the primary parameters, and outputting the secondary parameters; and (b) a processor synthesizer for generating and outputting processor definition information to synthesize a processor, according to the secondary parameters, generated and output by the parameter generator, wherein the processor is provided with a predetermined instruction set including a plurality of instructions, each of the instruction being constituted by a plurality of fields, wherein the parameter generator determines individual lengths of the plurality of fields constituting an instruction as the secondary parameters based on the primary parameters, and wherein the processor synthesizer generates the processor definition information matched with the individual lengths of the plurality of fields determined as the secondary parameters, keeping the plurality of the instructions in the predetermined instruction set.

* * * * *